US011700021B2

(12) United States Patent
Sun et al.

(10) Patent No.: US 11,700,021 B2
(45) Date of Patent: *Jul. 11, 2023

(54) TECHNIQUES TO PROVIDE A CYCLIC REDUNDANCY CHECK FOR LOW DENSITY PARITY CHECK CODE CODEWORDS

(71) Applicant: QUALCOMM Incorporated, San Diego, CA (US)

(72) Inventors: Jing Sun, San Diego, CA (US); Taesang Yoo, San Diego, CA (US); Tao Luo, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/093,153

(22) Filed: Nov. 9, 2020

(65) Prior Publication Data
US 2021/0058096 A1 Feb. 25, 2021

Related U.S. Application Data

(63) Continuation of application No. 15/493,038, filed on Apr. 20, 2017, now Pat. No. 10,855,315, which is a
(Continued)

(51) Int. Cl.
*H03M 13/25* (2006.01)
*H03M 13/09* (2006.01)
(Continued)

(52) U.S. Cl.
CPC ......... *H03M 13/255* (2013.01); *H03M 13/09* (2013.01); *H03M 13/1105* (2013.01);
(Continued)

(58) Field of Classification Search
CPC ............... H03M 13/255; H03M 13/09; H03M 13/1105; H03M 13/2906; H03M 13/2957;
(Continued)

(56) References Cited

U.S. PATENT DOCUMENTS 8,014,449 B2 9/2011 Kwentus et al.
8,448,049 B2 5/2013 Sakai et al.
(Continued)

FOREIGN PATENT DOCUMENTS

CN 1882188 A 12/2006
CN 101159514 A 4/2008
(Continued)

OTHER PUBLICATIONS

"LTE; Evolved Universal Terrestrial Radio Access (E-UTRA); Multiplexing and channel coding (3GPP TS 36.212 version 12.4.0 Release 12)", Technical Specification, European Telecommunications Standards Institute (ETSI), 650, Route Des Lucioles, F-06921 Sophia-Antipolis, France, vol. 3GPP RAN 1, No. V12.4.0, Apr. 1, 2015 (Apr. 1, 2015), XP014248542, pp. 1-96.
(Continued)

*Primary Examiner* — James C Kerveros
(74) *Attorney, Agent, or Firm* — Holland & Hart LLP

(57) ABSTRACT

Techniques are described for wireless communication. One method includes segmenting a payload into a plurality of code blocks; generating, for each code block, a cyclic redundancy check (CRC); encoding each code block and associated CRC in one or more codewords of a plurality of codewords; and transmitting the codewords. The encoding is based at least in part on a low density parity check code (LDPCC) encoding type. Another method includes receiving a plurality of codewords associated with a payload encoded using a LDPCC encoding type; decoding a set of the codewords associated with the first payload and a CRC; and transmitting one of an acknowledgement (ACK) or a non-acknowledgement (NAK) for the set of the codewords.

30 Claims, 13 Drawing Sheets

Related U.S. Application Data continuation of application No. 15/369,525, filed on Dec. 5, 2016, now Pat. No. 10,367,530.

(60) Provisional application No. 62/278,689, filed on Jan. 14, 2016.

(51) Int. Cl.
| | |
|---|---|
| *H03M 13/29* | (2006.01) |
| *H03M 13/35* | (2006.01) |
| *H03M 13/00* | (2006.01) |
| *H04L 1/00* | (2006.01) |
| *H03M 13/11* | (2006.01) |
| *H04L 1/08* | (2006.01) |
| *H04L 1/1607* | (2023.01) |
| *H04L 5/00* | (2006.01) |
| *H04W 84/04* | (2009.01) |

(52) U.S. Cl.
CPC ... *H03M 13/2906* (2013.01); *H03M 13/2957* (2013.01); *H03M 13/35* (2013.01); *H03M 13/353* (2013.01); *H03M 13/6513* (2013.01); *H04L 1/007* (2013.01); *H04L 1/0041* (2013.01); *H04L 1/0045* (2013.01); *H04L 1/0057* (2013.01); *H04L 1/0058* (2013.01); *H04L 1/0061* (2013.01); *H04L 1/0066* (2013.01); *H04L 1/0075* (2013.01); *H04L 1/0083* (2013.01); *H04L 1/08* (2013.01); *H04L 1/1607* (2013.01); *H04L 5/0055* (2013.01); *H03M 13/1102* (2013.01); *H03M 13/356* (2013.01); *H03M 13/6306* (2013.01); *H04W 84/042* (2013.01)

(58) Field of Classification Search
CPC ............... H03M 13/35; H03M 13/353; H03M 13/6513; H03M 13/1102; H03M 13/356; H03M 13/6306; H04L 1/0041; H04L 1/0045; H04L 1/0057; H04L 1/0058; H04L 1/0061; H04L 1/0066; H04L 1/007; H04L 1/0075; H04L 1/0083; H04L 1/08; H04L 1/1607; H04L 5/0055; H04W 84/042
USPC ........................................................ 714/758
See application file for complete search history.

(56) References Cited

U.S. PATENT DOCUMENTS

| | | | |
|---|---|---|---|
| 8,612,834 B2 | 12/2013 | Kwok et al. | |
| 8,627,167 B1 | 1/2014 | Yang et al. | |
| 8,667,357 B2 | 3/2014 | Park | |
| 10,367,530 B2 | 7/2019 | Sun et al. | |
| 10,476,528 B2 | 11/2019 | Li et al. | |
| 2006/0190801 A1 | 8/2006 | Shin et al. | |
| 2006/0195752 A1 | 8/2006 | Walker et al. | |
| 2008/0163026 A1 | 7/2008 | Varnica et al. | |
| 2008/0168332 A1 | 7/2008 | Palanki et al. | |
| 2009/0028448 A1 | 1/2009 | Collomosse et al. | |
| 2009/0241006 A1 | 9/2009 | Liikanen et al. | |
| 2010/0115376 A1 | 5/2010 | Shalvi et al. | |
| 2010/0162078 A1 | 6/2010 | Miller et al. | |
| 2010/0208680 A1 | 8/2010 | Nam et al. | |
| 2011/0055652 A1* | 3/2011 | Park | H04L 5/0007 714/748 |
| 2012/0089890 A1 | 4/2012 | Palanki et al. | |
| 2012/0144265 A1 | 6/2012 | Hwang et al. | |
| 2012/0159281 A1 | 6/2012 | Shalvi et al. | |
| 2012/0233521 A1 | 9/2012 | Kwok et al. | |
| 2013/0324138 A1 | 12/2013 | Chang et al. | |
| 2015/0082131 A1 | 3/2015 | Jeong et al. | |
| 2015/0214981 A1 | 7/2015 | Prodan | |
| 2015/0281743 A1 | 10/2015 | Yi et al. | |
| 2016/0164538 A1 | 6/2016 | Chang et al. | |
| 2016/0164544 A1 | 6/2016 | Cavaliere et al. | |
| 2016/0277104 A1 | 9/2016 | Kim et al. | |
| 2016/0374037 A1 | 12/2016 | Lee et al. | |
| 2017/0170925 A1* | 6/2017 | Xu | H04L 1/0058 |
| 2017/0207880 A1 | 7/2017 | Lee et al. | |
| 2017/0222661 A1 | 8/2017 | Sun et al. | |
| 2017/0279464 A1 | 9/2017 | Noh et al. | |
| 2017/0324428 A1* | 11/2017 | Li | H03M 13/1515 |
| 2018/0145703 A1 | 5/2018 | Li et al. | |
| 2019/0140784 A1 | 5/2019 | Xi et al. | |

FOREIGN PATENT DOCUMENTS

| | | |
|---|---|---|
| CN | 101480071 A | 7/2009 |
| CN | 101867440 A | 10/2010 |
| CN | 102469313 A | 5/2012 |
| CN | 103457611 A | 12/2013 |
| JP | H08223624 A | 8/1996 |
| JP | 2009111941 A | 5/2009 |

OTHER PUBLICATIONS

Chen H., et al., "A LDPC and Turbo Codes Hybrid Coding Scheme Based on OFDM System," IEEE 6th International Conference on Wireless Communications Networking and Mobile Computing (WiCOM), Sep. 23, 2010, pp. 1-4, XP031828007.

International Preliminary Report on Patentability—PCT/US2016/065145, The International Bureau of WIPO—Geneva, Switzerland, dated Jul. 26, 2018.

International Search Report and Written Opinion—PCT/US2016/065145—ISA/EPO—dated Mar. 31, 2017.

ETSI: "Universal Mobile Telecommunications System (UMTS), Multiplexing and Channel Coding (FDD) (3GPP TS 25.212 version 11.3.0 Release 11)", ETSI TS 125 212 V11.3.0, Sep. 1, 2012 XP055189839, pp. 1-138.

* cited by examiner

TECHNIQUES TO PROVIDE A CYCLIC REDUNDANCY CHECK FOR LOW DENSITY PARITY CHECK CODE CODEWORDS

CROSS REFERENCES

The present Application for Patent is a continuation of U.S. patent application Ser. No. 15/493,038 by Sun et al., entitled "Techniques to Provide a Cyclic Redundancy Check For Low Density Parity Check Code Codewords" filed Apr. 20, 2017, which is a continuation of U.S. patent application Ser. No. 15/369,525 by Sun et al., entitled "Unified Code Block Segmentation Providing A Cyclic Redundancy Check For Low Density Parity Check Code Codewords," filed Dec. 5, 2016 and claims priority to U.S. Provisional Patent Application No. 62/278,689 by Sun, et al., entitled "Unified Code Block Segmentation Providing A Cyclic Redundancy Check For Low Density Parity Check Code Codewords," filed Jan. 14, 2016, assigned to the assignee hereof.

BACKGROUND

Field of the Disclosure

The present disclosure, for example, relates to wireless communication systems, and more particularly to techniques to provide a cyclic redundancy check (CRC) for low density parity check code (LDPCC) codewords.

Description of Related Art

Wireless communication systems are widely deployed to provide various types of communication content such as voice, video, packet data, messaging, broadcast, and so on. These systems may be multiple-access systems capable of supporting communication with multiple users by sharing the available system resources (e.g., time, frequency, and power). Examples of such multiple-access systems include code-division multiple access (CDMA) systems, time-division multiple access (TDMA) systems, frequency-division multiple access (FDMA) systems, and orthogonal frequency-division multiple access (OFDMA) systems, (e.g., a Long Term Evolution (LTE) system, or a New Radio (NR) system). A wireless multiple-access communication system may include a number of base stations, each simultaneously supporting communication for multiple communication devices, otherwise known as user equipment (UE).

In some wireless communication systems, base stations and UEs may communicate using one or more enhanced component carriers (eCCs). An eCC may be provided in a contention-based radio frequency spectrum band or a contention-free radio frequency spectrum band. A contention-based radio frequency spectrum band is a radio frequency spectrum band for which transmitting devices may contend for access (e.g., a radio frequency spectrum band that is available for unlicensed use, such as Wi-Fi use, or a radio frequency spectrum band that is available for use by multiple operators in an equally shared or prioritized manner). A contention-free radio frequency spectrum band is a radio frequency spectrum band for which transmitting devices may not contend for access because the radio frequency spectrum band is licensed to particular users for particular uses (e.g., a licensed radio frequency spectrum band usable for Long-Term Evolution (LTE) or LTE-Advanced (LTE-A) communications). Because eCCs, LTE/LTE-A component carriers (CCs), and Wi-Fi CCs may share the same radio frequency spectrum band, LTE/LTE-A or Wi-Fi transmission techniques (e.g., encoding techniques) may in some cases be leveraged for eCC transmissions. In other cases, new or different transmission techniques may be better suited for eCC transmissions.

SUMMARY eCCs are being designed for higher data rate transmissions than LTE/LTE-A CCs. LTE/LTE-A transmissions may be encoded using turbo code (TC) encoding. TC encoding is useful in that it supports hybrid automatic repeat request (HARD) processes, puncturing, and rate matching. TC encoding can be used for eCC transmissions, but tends to increase decoding complexity (e.g., compared to certain other types of encoding, such as LDPCC encoding). The complexity of TC decoding may be further increased under high data rate conditions, as may be used for eCC transmissions. For example, the number of TC decoders deployed in a receiver may need to be increased, to provide satisfactory decoding throughput under high data rate conditions, when using TC encoding for high data rate eCC transmissions. In contrast to LTE/LTE-A transmissions, Wi-Fi transmissions may be encoded using LDPCC encoding. LDPCC encoding may be used for eCC transmissions, and may reduce decoding complexity by an order of magnitude in comparison to TC encoding. When TC encoding is used, a CRC is appended to each codeword for decoding error protection. When LDPCC encoding is used, a CRC is normally not needed, as the code structure provides parity checks for decoding error detection. However, when a LDPCC codeword is short, the parity check provided by the code structure is not reliable enough and there may be residual false alarm events. On the other hand, appending a CRC to a codeword increases data transmission overhead, and the relative increase in overhead can be high if a CRC is appended to a codeword having a payload with a small number of bits. The present disclosure describes a unified code block segmentation that provides a CRC for LDPCC codewords. The CRC for LDPCC codewords may be generated at a code block level, similar to how a CRC is generated for a TC code block. The CRC may correspond to multiple LDPCC codewords.

In one example, a method for wireless communication is described. The method may include segmenting a payload into a plurality of code blocks; generating, for each code block, a CRC; encoding each code block and associated CRC in one or more codewords of a plurality of codewords; and transmitting the codewords. The encoding may be based at least in part on a LDPCC encoding type.

In some examples, the method may include receiving a non-acknowledgement (NAK) of a code block associated with the first payload. In some examples, the method may include retransmitting a plurality of LDPCC codewords associated with the code block and the CRC associated with the code block.

In one example, a device for wireless communication is described. The device may include a processor, memory in electronic communication with the processor, and instructions stored in the memory. The instructions may be executable by the processor to segment a payload into a plurality of code blocks; to generate, for each code block, a CRC; encode each code block and associated CRC in one or more codewords of a plurality of codewords; and to transmit the codewords. The encoding may be based at least in part on a LDPCC encoding type.

In some examples of the device, the instructions may be executable by the processor to receive a NAK of a code block associated with the first payload. In some examples of the device, the instructions may be executable by the processor to retransmit a plurality of LDPCC codewords associated with the code block and the CRC associated with the code block.

In one example, a method for wireless communication is described. The method may include receiving a plurality of codewords associated with a payload encoded using a LDPCC encoding type; decoding a set of the codewords associated with the first payload and a CRC; and transmitting one of an ACK or a NAK for the set of the codewords.

In some examples of the method, the NAK may be transmitted for the set of the codewords, and the method may further include receiving a retransmission of the set of codewords.

In one example, a device for wireless communication is described. The device may include a processor, memory in electronic communication with the processor, and instructions stored in the memory. The instructions may be executable by the processor to receive a plurality of codewords associated with a payload encoded using a LDPCC encoding type; to decode a set of the codewords associated with the first payload and a CRC; and to transmit one of an ACK or a NAK for the set of the codewords.

In some examples of the device, the NAK may be transmitted for the set of the codewords, and the instructions may be executable by the processor to receive a retransmission of the set of codewords.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purpose of illustration and description, and not as a definition of the limits of the claims.

BRIEF DESCRIPTION OF THE DRAWINGS

A further understanding of the nature and advantages of the present disclosure may be realized by reference to the following drawings. In the appended figures, similar components or features may have the same reference label. Further, various components of the same may be distinguished by following the reference label by a dash and a second label that distinguishes among the similar components. If just the first reference label is used in the specification, the description is applicable to any one of the similar components having the same first reference label irrespective of the second reference label.

DETAILED DESCRIPTION

Some wireless communication systems (e.g., a Long Term Evolution (LTE) system, or a New Radio (NR) system (5G)) may use eCCs to improve throughput, latency, or reliability of wireless communications. An eCC may be characterized by a short symbol duration, wide tone spacing, short subframe duration, operation in a contention-based radio frequency spectrum band (or in a contention-free radio frequency spectrum band), or wide bandwidth. An eCC may have a relatively wide bandwidth (e.g. 80 MHz or 100 MHz) as compared to a non-eCC (e.g., an LTE/LTE-A component carrier (CC), Licensed Assisted Access (LAA) CC, or Stand Alone CC in a contention-based radio frequency spectrum band), which may have a relatively smaller bandwidth (e.g. 20 MHz). An eCC may include one or more channels (e.g., segments of bandwidth, such as four 20 MHz segments of bandwidth).

The present disclosure describes a unified code block segmentation in which a CRC is provided for LDPCC codewords. In some examples, the techniques may be used to encode eCC payloads.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in other examples.

Figure 1:
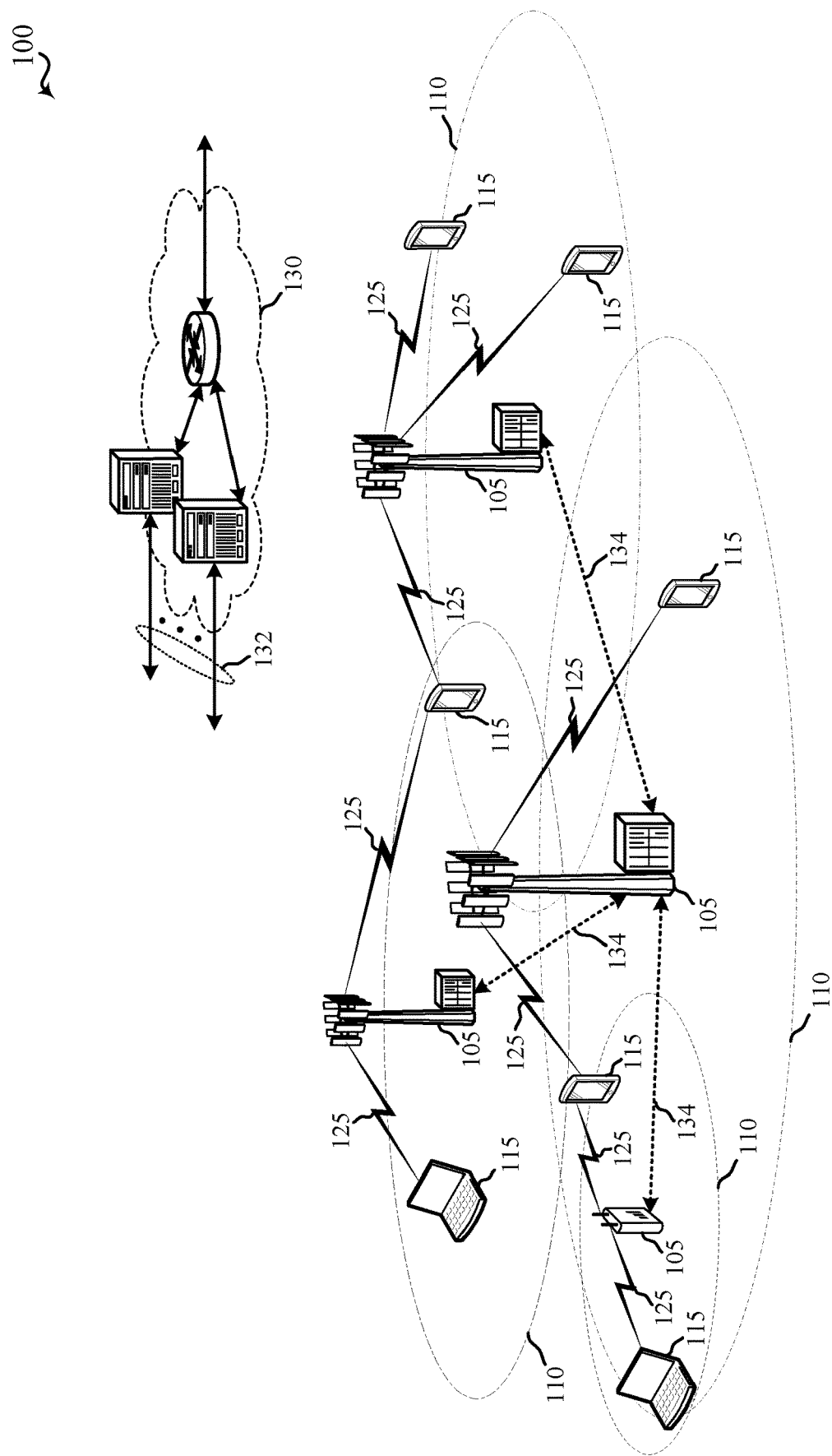
FIG. 1 shows an example of a wireless communication system, in accordance with various aspects of the present disclosure.

FIG. 1 shows an example of a wireless communication system 100, in accordance with various aspects of the present disclosure. The wireless communication system 100 may include base stations 105, UEs 115, and a core network 130. In some examples, the wireless communications system 100 may be an LTE (or LTE-Advanced) network, or a New Radio (NR) network. In some cases, wireless communications system 100 may support enhanced broadband communications, ultra-reliable (i.e., mission critical) communications, low latency communications, and communications with low-cost and low-complexity devices. The core network 130 may provide user authentication, access authorization, tracking, Internet Protocol (IP) connectivity, and other access, routing, or mobility functions. The base stations 105 may interface with the core network 130 through backhaul links 132 (e.g., S1, etc.) and may perform radio configuration and scheduling for communication with the UEs 115, or may operate under the control of a base station controller (not shown). In various examples, the base stations 105 may communicate, either directly or indirectly (e.g., through core network 130), with each other over backhaul links 134 (e.g., X2, etc.), which may be wired or wireless communication links.

The base stations 105 may wirelessly communicate with the UEs 115 via one or more base station antennas. Each of the base station 105 sites may provide communication coverage for a respective geographic coverage area 110. In some examples, a base station 105 may be referred to as a base transceiver station, a radio base station, an access point, a radio transceiver, a NodeB, an evolved NodeB (eNB), a Home NodeB, a Home eNodeB, or some other suitable terminology. The geographic coverage area 110 for a base station 105 may be divided into sectors (not shown) making up a portion of the coverage area. The wireless communication system 100 may include base stations 105 of different types (e.g., macro or small cell base stations). There may be overlapping geographic coverage areas 110 for different technologies.

In some examples, the wireless communication system 100 may include an LTE/LTE-A network and may employ narrowband communication techniques, as described below. In LTE/LTE-A networks, the term eNB may be used to describe the base stations 105. The wireless communication system 100 may be a Heterogeneous LTE/LTE-A network in which different types of eNBs provide coverage for various geographical regions. For example, each eNB or base station 105 may provide communication coverage for a macro cell, a small cell, or other types of cell. The term "cell" is a 3GPP term that can be used to describe a base station, a carrier or component carrier associated with a base station, or a coverage area (e.g., sector, etc.) of a carrier or base station, depending on context.

A macro cell may cover a relatively large geographic area (e.g., several kilometers in radius) and may allow unrestricted access by UEs with service subscriptions with the network provider. A small cell may be a lower-powered base station, as compared with a macro cell that may operate in the same or different (e.g., contention-free, contention-based, etc.) radio frequency spectrum bands as macro cells. Small cells may include pico cells, femto cells, and micro cells according to various examples. A pico cell may cover a relatively smaller geographic area and may allow unrestricted access by UEs with service subscriptions with the network provider. A femto cell also may cover a relatively small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB or a home eNB. An eNB may support one or multiple (e.g., two, three, four, and the like) cells (e.g., component carriers).

The wireless communication system 100 may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

The communication networks that may accommodate some of the various disclosed examples may be packet-based networks that operate according to a layered protocol stack. In the user plane, communications at the bearer or Packet Data Convergence Protocol (PDCP) layer may be IP-based. A Radio Link Control (RLC) layer may perform packet segmentation and reassembly to communicate over logical channels. A Medium Access Control (MAC) layer may perform priority handling and multiplexing of logical channels into transport channels. The MAC layer may also use HARQ to provide retransmission at the MAC layer to improve link efficiency. In the control plane, the Radio Resource Control (RRC) protocol layer may provide establishment, configuration, and maintenance of an RRC connection between a UE 115 and the base stations 105 or core network 130 supporting radio bearers for the user plane data. At the Physical (PHY) layer, the transport channels may be mapped to Physical channels.

Time intervals in LTE or NR may be expressed in multiples of a basic time unit (which may be a sampling period of $T_s = 1/30,720,000$ seconds). Time resources may be organized according to radio frames of length of 10 ms ($T_f = 307200T_s$), which may be identified by a system frame number (SFN) ranging from 0 to 1023. Each frame may include ten 1 ms subframes numbered from 0 to 9. A subframe may be further divided into two 0.5 ms slots, each of which contains 6 or 7 modulation symbol periods (depending on the length of the cyclic prefix prepended to each symbol). Excluding the cyclic prefix, each symbol contains 2048 sample periods. In some cases the subframe may be the smallest scheduling unit, also known as a TTI. In other cases, a TTI may be shorter than a subframe or may be dynamically selected (e.g., in short TTI bursts or in selected component carriers using short TTIs).

A resource element may consist of one symbol period and one subcarrier (e.g., a 15 KHz frequency range). A resource block may contain 12 consecutive subcarriers in the frequency domain and, for a normal cyclic prefix in each OFDM symbol, 7 consecutive OFDM symbols in the time domain (1 slot), or 84 resource elements. The number of bits carried by each resource element may depend on the modulation scheme (the configuration of symbols that may be selected during each symbol period). Thus, the more resource blocks that a UE receives and the higher the modulation scheme, the higher the data rate may be.

The UEs 115 may be dispersed throughout the wireless communication system 100, and each UE 115 may be stationary or mobile. A UE 115 may also include or be referred to by those skilled in the art as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may be a cellular phone, a personal digital assistant (PDA), a wireless modem, a wireless communication device, a handheld device, a tablet computer, a laptop computer, a cordless phone, a wireless local loop (WLL) station, a NB-LTE device, a M2M device, a Machine Type Communication (MTC) device, a NB-IoT device or the like. A UE may be able to communicate with various types of base stations and network equipment, including macro eNBs, small cell eNBs, relay base stations, and the like.

The communication links 125 shown in wireless communication system 100 may include downlink (DL) transmissions, from a base station 105 to a UE 115, or uplink (UL) transmissions, from a UE 115 to a base station 105. The DL transmissions may also be called forward link transmissions, while the UL transmissions may also be called reverse link transmissions. The communication links 125 may include dedicated Physical Uplink Control Channel (PUCCH) resources for narrowband communication, as described in the present disclosure.

In some examples, each communication link 125 may include one or more carriers, where each carrier may be a signal made up of multiple sub-carriers (e.g., waveform signals of different frequencies) modulated according to the various radio technologies described above. Each modulated signal may be sent on a different sub-carrier and may carry control information (e.g., reference signals, control channels, etc.), overhead information, user data, etc. The communication links 125 may transmit bidirectional communications using a frequency division duplexing (FDD) operation (e.g., using paired spectrum resources) or a time division duplexing (TDD) operation (e.g., using unpaired spectrum resources). Frame structures for FDD operation (e.g., frame structure type 1) and TDD operation (e.g., frame structure type 2) may be defined.

In some examples, the wireless communication system 100 may support operation over a contention-free radio frequency spectrum band (e.g., a radio frequency spectrum band for which transmitting apparatuses may not contend for access because the radio frequency spectrum band is licensed to particular users for particular uses (e.g., a licensed radio frequency spectrum band usable for LTE/ LTE-A communications)) or a contention-based radio frequency spectrum band (e.g., a radio frequency spectrum band for which transmitting apparatuses may contend for access (e.g., a radio frequency spectrum band that is available for unlicensed use, such as Wi-Fi use, a radio frequency spectrum band that is available for use by different radio access technologies, or a radio frequency spectrum band that is available for use by multiple operators in an equally shared or prioritized manner)). Upon winning contention for access to a channel of the contention-based radio frequency spectrum band, a transmitting apparatus (e.g., a base station 105 or UE 115) may transmit one or more channel reservation signals (e.g., one or more channel usage beacon signals (CUBS) over the channel. The CUBS may reserve the channel by providing a detectable energy on the channel. The CUBS may also serve to identify the transmitting apparatus or synchronize the transmitting apparatus and a receiving apparatus.

In some cases, the wireless communication system 100 may utilize one or more eCCs. An eCC may be characterized by one or more features including: wide bandwidth, short symbol duration, wide tone spacing, smaller transmission time intervals (TTIs), and operation in a contention-based radio frequency spectrum band (or in a contention-free radio frequency spectrum band). In some cases, an eCC may be associated with a carrier aggregation (CA) configuration or a dual connectivity configuration (e.g., when multiple serving cells have a suboptimal backhaul link). An eCC may also be configured for use in unlicensed spectrum or shared spectrum (where more than one operator is allowed to use the spectrum). An eCC characterized by wide bandwidth may include one or more segments that may be utilized by UEs 115 that are not capable of monitoring the whole bandwidth or prefer to use a limited bandwidth (e.g., to conserve power).

In some cases, an eCC may utilize a different symbol duration than other CCs, which may include use of a reduced symbol duration as compared with symbol durations of the other CCs. A shorter symbol duration may be associated with increased subcarrier spacing. A TTI in an eCC may consist of one or multiple symbols. In some cases, the TTI duration (that is, the number of symbols in a TTI) may be variable. In some cases, an eCC may utilize a different symbol duration than other CCs, which may include use of a reduced symbol duration as compared with symbol durations of the other CCs. A shorter symbol duration is associated with increased subcarrier spacing. A device, such as a UE 115 or base station 105, utilizing eCCs may transmit wideband signals (e.g., 20, 40, 60, 80 MHz, etc.) at reduced symbol durations (e.g., 16.67 microseconds). A TTI in eCC may consist of one or multiple symbols. In some cases, the TTI duration (that is, the number of symbols in a TTI) may be variable.

In some cases, wireless system 100 may utilize both licensed and unlicensed radio frequency spectrum bands. For example, wireless system 100 may employ LTE License Assisted Access (LTE-LAA) or LTE Unlicensed (LTE U) radio access technology or NR technology in an unlicensed band such as the 5 Ghz Industrial, Scientific, and Medical (ISM) band. When operating in unlicensed radio frequency spectrum bands, wireless devices such as base stations 105 and UEs 115 may employ listen-before-talk (LBT) procedures to ensure the channel is clear before transmitting data. In some cases, operations in unlicensed bands may be based on a carrier aggregation (CA) configuration in conjunction with component carriers (CCs) operating in a licensed band. Operations in unlicensed spectrum may include downlink transmissions, uplink transmissions, or both. Duplexing in unlicensed spectrum may be based on frequency division duplexing (FDD), time division duplexing (TDD) or a combination of both.

Figure 2:
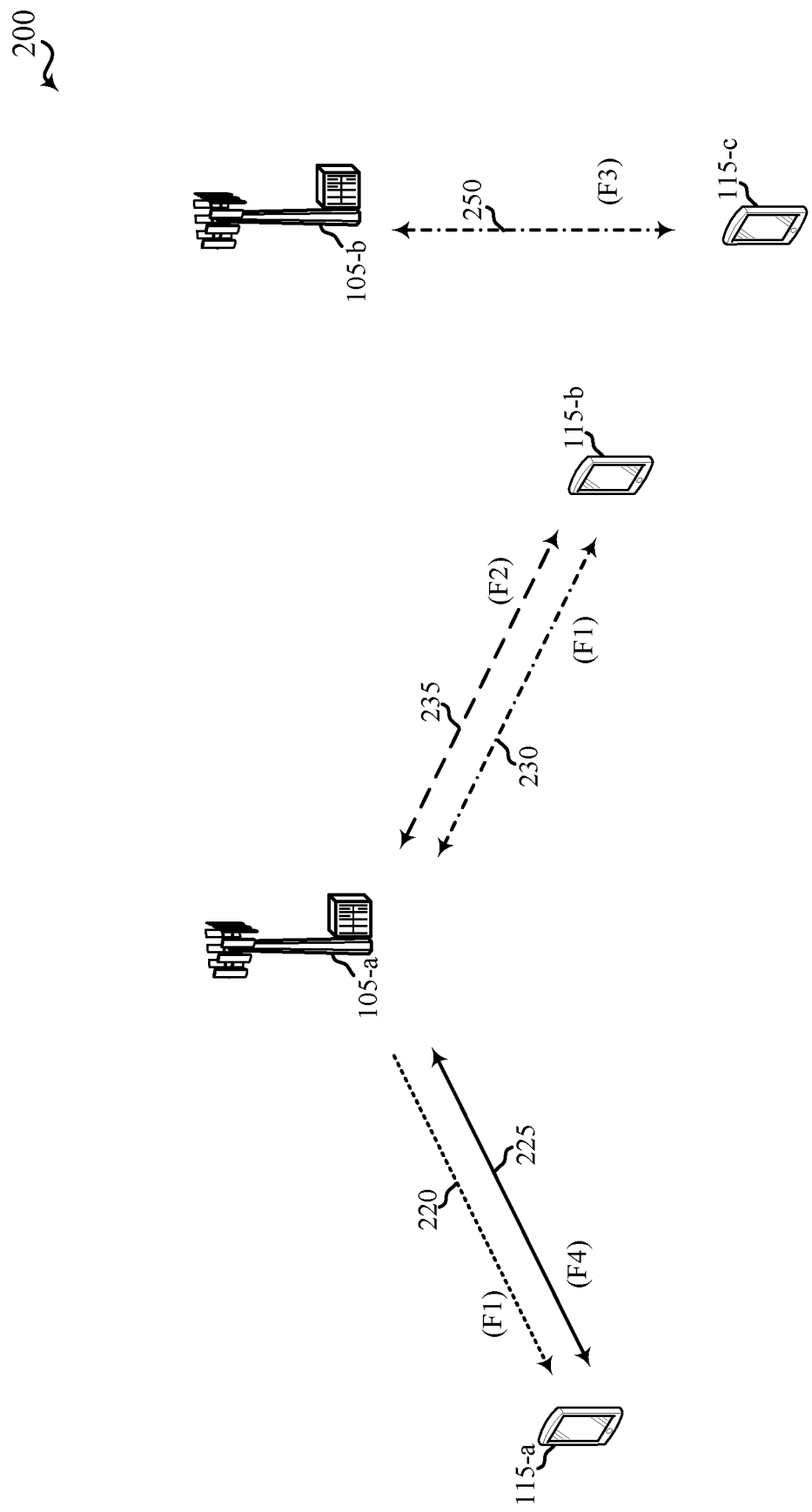
FIG. 2 shows a wireless communication system in which LTE/LTE-A may be deployed under different scenarios using a contention-based radio frequency spectrum band, in accordance with various aspects of the present disclosure.

FIG. 2 shows a wireless communication system 200 in which LTE/LTE-A CCs or eCCs may be deployed under different scenarios using a contention-based radio frequency spectrum band, in accordance with various aspects of the present disclosure. More specifically, FIG. 2 illustrates examples of a supplemental downlink mode (also referred to as a first licensed assisted access mode), a carrier aggregation mode (also referred to as a second licensed assisted access mode), and a standalone mode, in which LTE/LTE-A and/or eCC OFDM numerology is employed using a contention-based radio frequency spectrum band. The wireless communication system 200 may be an example of portions of the wireless communication system 100 described with reference to FIG. 1. Moreover, a first base station 105-*a* and a second base station 105-*b* may be examples of aspects of one or more of the base stations 105 described with reference to FIG. 1, while a first UE 115-*a*, a second UE 115-*b*, and a third UE 115-*c* may be examples of aspects of one or more of the UEs 115 described with reference to FIG. 1.

In the example of the supplemental downlink mode (e.g., the first licensed assisted access mode) in the wireless communication system 200, the first base station 105-*a* may transmit OFDMA waveforms to the first UE 115-*a* using a downlink channel 220. The downlink channel 220 may be associated with a frequency F1 in a contention-based radio frequency spectrum band. The first base station 105-*a* may transmit OFDMA waveforms to the first UE 115-*a* using a first bidirectional link 225 and may receive SC-FDMA waveforms from the first UE 115-*a* using the first bidirectional link 225. The first bidirectional link 225 may be associated with a frequency F4 in a contention-free radio frequency spectrum band. The downlink channel 220 in the contention-based radio frequency spectrum band and the first bidirectional link 225 in the contention-free radio frequency spectrum band may operate contemporaneously. The downlink channel 220 may provide a downlink capacity offload for the first base station 105-*a*. In some examples, the downlink channel 220 may be used for unicast services (e.g., addressed to one UE) or for multicast services (e.g., addressed to several UEs). This scenario may occur with any service provider (e.g., a mobile network operator (MNO)) that uses a contention-free radio frequency spectrum and needs to relieve some of the traffic or signaling congestion.

In the example of the carrier aggregation mode (e.g., the second licensed assisted access mode) in the wireless communication system 200, the first base station 105-*a* may transmit OFDMA waveforms to the second UE 115-*b* using a second bidirectional link 230 and may receive OFDMA waveforms, SC-FDMA waveforms, or resource block interleaved FDMA waveforms from the second UE 115-*b* using the second bidirectional link 230. The second bidirectional link 230 may be associated with the frequency F1 in the contention-based radio frequency spectrum band. The first base station 105-*a* may also transmit OFDMA waveforms to the second UE 115-*b* using a third bidirectional link 235 and may receive SC-FDMA waveforms from the second UE 115-*b* using the third bidirectional link 235. The third bidirectional link 235 may be associated with a frequency F2 in a contention-free radio frequency spectrum band. The second bidirectional link 230 may provide a downlink and uplink capacity offload for the first base station 105-*a*. Like the supplemental downlink mode (e.g., licensed assisted access mode) described above, this scenario may occur with any service provider (e.g., MNO) that uses a contention-free radio frequency spectrum and needs to relieve some of the traffic or signaling congestion.

As described above, one type of service provider that may benefit from the capacity offload offered by using LTE/LTE-A in a contention-based radio frequency spectrum band is a traditional MNO having access rights to an LTE/LTE-A contention-free radio frequency spectrum band. For these service providers, an operational example may include a bootstrapped mode (e.g., supplemental downlink, carrier aggregation) that uses the LTE/LTE-A primary component carrier (PCC) on the contention-free radio frequency spectrum band and at least one secondary component carrier (SCC) on the contention-based radio frequency spectrum band.

In the carrier aggregation mode, data and control may, for example, be communicated in the contention-free radio frequency spectrum band (e.g., via first bidirectional link 225 or third bidirectional link 235) while data may, for example, be communicated in the contention-based radio frequency spectrum band (e.g., via second bidirectional link 230). The carrier aggregation mechanisms supported when using a contention-based radio frequency spectrum band may fall under a hybrid frequency division duplexing-time division duplexing (FDD-TDD) carrier aggregation or a TDD-TDD carrier aggregation with different symmetry across component carriers.

In one example of a standalone mode in the wireless communication system 200, the second base station 105-*b* may transmit OFDMA waveforms to the third UE 115-*c* using a bidirectional link 250 and may receive OFDMA waveforms, SC-FDMA waveforms, or resource block interleaved FDMA waveforms from the third UE 115-*c* using the bidirectional link 250. The bidirectional link 250 may be associated with the frequency F3 in the contention-based radio frequency spectrum band. The standalone mode may be used in non-traditional wireless access scenarios, such as in-stadium access (e.g., unicast, multicast). An example of a type of service provider for this mode of operation may be a stadium owner, cable company, event host, hotel, enterprise, or large corporation that does not have access to a contention-free radio frequency spectrum band.

In some examples, a transmitting apparatus such as one of the base stations 105 described with reference to FIGS. 1 and 2, or one of the UEs 115 described with reference to FIGS. 1 and 2, may use a gating interval to gain access to a channel of a contention-based radio frequency spectrum band (e.g., to a physical channel of the contention-based radio frequency spectrum band). In some examples, the gating interval may be synchronous and periodic. For example, the periodic gating interval may be synchronized with at least one boundary of an LTE/LTE-A radio interval. In other examples, the gating interval may be asynchronous. The gating interval may define the application of a contention-based protocol, such as a Listen-Before-Talk (LBT) protocol based on the LBT protocol specified in European Telecommunications Standards Institute (ETSI) (EN 301 893). When using a gating interval that defines the application of an LBT protocol, the gating interval may indicate when a transmitting apparatus needs to perform a contention procedure (e.g., an LBT procedure) such as a Clear Channel Assessment (CCA) procedure or an eCCA procedure. The outcome of the CCA procedure or eCCA procedure may indicate to the transmitting apparatus whether a channel of a contention-based radio frequency spectrum band is available or in use for the gating interval (e.g., an LBT radio frame or transmission burst). When a CCA procedure or eCCA procedure indicates the channel is available for a corresponding LBT radio frame or transmission burst (e.g., "clear" for use), the transmitting apparatus may reserve or use the channel of the contention-based radio frequency spectrum band during part or all of the LBT radio frame. When the CCA procedure indicates that the channel is not available (e.g., that the channel is in use or reserved by another transmitting apparatus), the transmitting apparatus may be prevented from using the channel during the LBT radio frame.

Transmissions made in the wireless communication system 100 or 200 may be encoded. In the case of eCC transmissions (and possibly other transmissions), the transmissions may be encoded, for example, using TC encoding or LDPCC encoding. When using TC encoding, a payload (or transport block) may be segmented into multiple code blocks. In some examples, the size of each code block may be less than or equal to 6,144 bits, and a 24 bit CRC may be generated for (and added to) each code block. The CRC provides support for a code block level acknowledgement (ACK) or non-acknowledgement (NAK) having a sufficiently low error probability. When using LDPCC encoding (e.g., IEEE Std. 802.11n LDPCC encoding) in its native form, parity checks can be used to check whether a decoded sequence is a valid codeword. However, the parity checks are short and may not be associated with a sufficiently low error probability (e.g., the error probability may not be equivalent to the error probability associated with TC decoding ACKs/NAKs.

One way to decrease the error probability associated with LDPCC decoding is to generate a CRC per LDPCC codeword. However, the overhead in doing so can be relatively high, as LDPCC codewords can be relatively short. Alternatively, a CRC may be generated at a LDPCC code block level. A payload may in some cases be segmented into LDPCC code blocks that are about the same size as TC code blocks (e.g., code blocks that are no longer than 6,144 bits). A LDPCC code block size may be selected such that the overhead of adding a CRC to the code block is sufficiently small (as determined by the application). A LDPCC code block, with CRC, may be further divided into multiple LDPCC codewords. In some examples, the LDPCC codewords may have equal codeword lengths. However, in the case of equal codeword lengths, the allowed set of LDPCC code block lengths may be smaller than the allowed set of TC code block lengths.

Given a CRC per LDPCC code block, LDPCC encoded payloads may be ACK'd/NAK'd at the code block level (e.g., all of the LDPCC codewords corresponding to a LDPCC code block may be ACK'd or NAK'd as a bundle).

Figure 3:
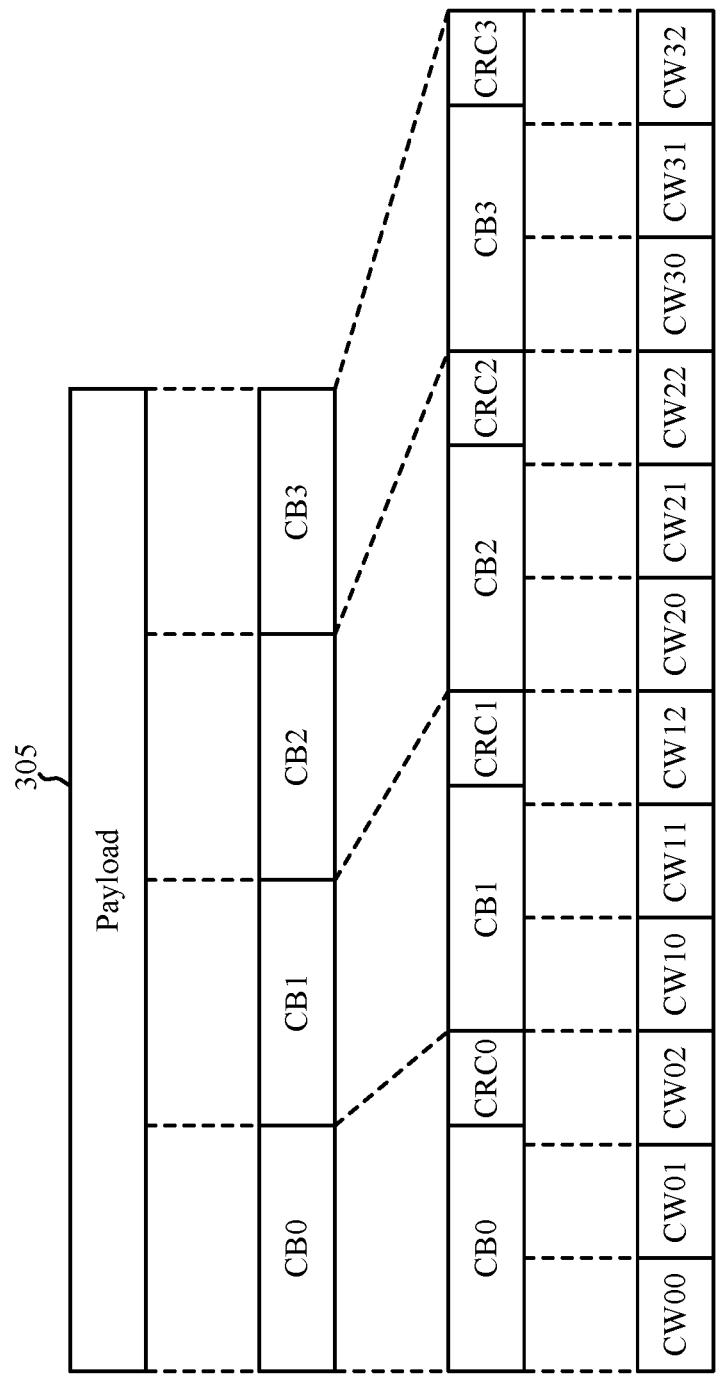
FIG. 3 shows a diagram of a payload that may be segmented into code blocks before the code blocks are encoded using LDPCC encoding, in accordance with various aspects of the present disclosure.

FIG. 3 shows a diagram 300 of a payload 305 that may be segmented into code blocks before the code blocks are encoded using LDPCC encoding, in accordance with various aspects of the present disclosure. The payload 305 may be transmitted, for example, by any of the base stations 105 or UEs 115 described with reference to FIG. 1 or 2.

When the payload 305 is encoded using LDPCC encoding, the payload 305 may be segmented into a plurality of LDPCC code blocks, including a first code block (CB0), a second code block (CB1), a third code block (CB2), and a fourth code block (CB3). A CRC may then be generated for each code block (e.g., a first CRC (CRC0) may be generated for the first code block (CB0), a second CRC (CRC1) may be generated for the second code block (CB1), a third CRC (CRC2) may be generated for the third code block (CB2), and a fourth CRC (CRC3) may be generated for the fourth code block (CB3)). Each LDPCC code block and associated CRC may then be encoded in a plurality of LDPCC codewords (e.g., the first code block (CB0) and first CRC (CRC0) may be encoded in the LDPCC codewords CW00, CW01, and CW02; the second code block (CB1) and second CRC (CRC1) may be encoded in the LDPCC codewords CW10, CW11, and CW12; the third code block (CB2) and third CRC (CRC2) may be encoded in the LDPCC codewords CW20, CW21, and CW22; and the fourth code block (CB3) and fourth CRC (CRC3) may be encoded in the LDPCC codewords CW30, CW31, and CW32).

Figure 4:
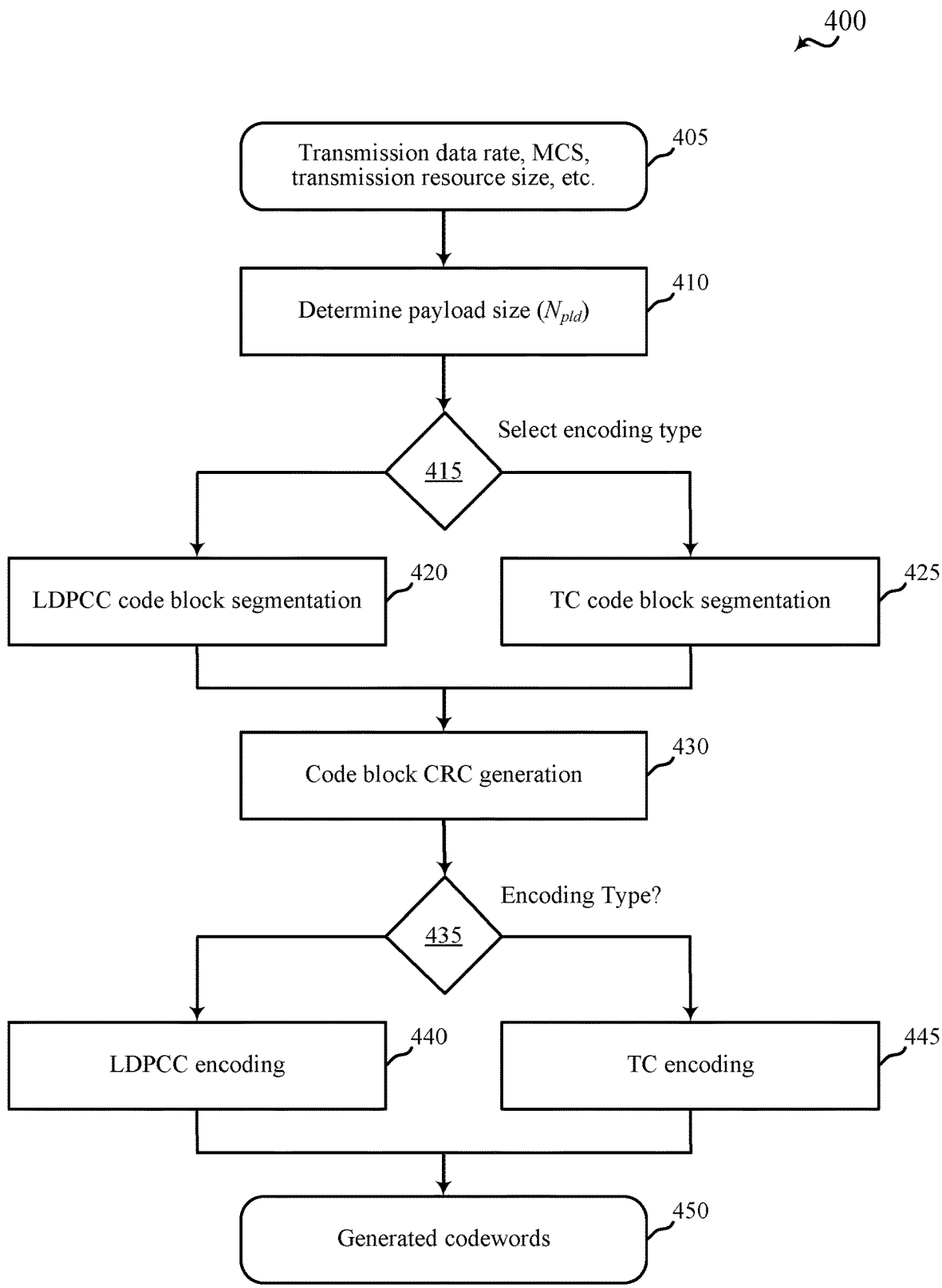
FIG. 4 is a flow chart illustrating an example method for unified code block segmentation, in accordance with various aspects of the present disclosure.

FIG. 4 is a flow chart illustrating an example method 400 for unified code block segmentation, in accordance with various aspects of the present disclosure. In some examples, the method 400 may be performed by a device such as one of the base stations 105 or UEs 115 described with reference to FIG. 1 or 2.

At block 405, the method 400 may receive, as input, a transmission data rate (e.g., a modulation and coding scheme (MCS)), a transmission resource size, or a combination thereof.

At block 410, the method 400 may include determining a payload size ($N_{pld}$) of a payload. In some examples, the payload size may be based at least in part on the transmission data rate or the transmission resource size.

At block 415, the method 400 may include selecting an encoding type for the payload. The encoding type may be based at least in part on the payload size. When the payload size is less than a threshold, a LDPCC encoding type may be selected for the payload, and the method 400 may continue at block 420. When the payload size is greater than the threshold, a TC encoding type may be selected for the payload, and the method 400 may continue at block 425.

At block 420, the method 400 may include segmenting the payload into a plurality of LDPCC code blocks; and at block 425, the method 400 may include segmenting the payload into a plurality of TC code blocks. In some examples, a same code block size limit ($N_0$) may be applied to the segmentation performed at block 420 or 425. In some examples, $N_0$=6144, as in an LTE/LTE-A network. Regardless of whether a payload is segmented into code blocks at block 420 or 425, the payload (or transport block (TB)) may be split into a minimum number of code blocks, subject to the $N_0$ code block size limit, if any. In some examples, each of the code blocks may have a same or similar size. In some examples, filler bits may be combined with the payload to maintain an equal code block length. In some examples, the size of the code blocks used to segment the payload at block 425 (and in some cases, at block 420) may be identified from a list of allowed code block sizes.

At block 430, the method 400 may include generating a CRC for each of the code blocks received from block 420 or 425.

At block 435, the method 400 may branch to one of blocks 440 or 445, depending on the encoding type selected at block 415. When a LDPCC encoding type is selected at block 415, the method 400 may continue at block 440. When a TC encoding type is selected at block 415, the method 400 may continue at block 445.

At block 440, the method 400 may include encoding each code block and associated CRC in one or more LDPCC codewords. In some examples, each codeword associated with a same code block may be have an equal codeword length, and each code block may be encoded in an integer number of LDPCC codewords (and conversely, each LDPCC code block identified at block 420 may be an integer multiple of the equal codeword length).

At block 445, the method 400 may include encoding each code block and associated CRC in one or more TC codewords. At block 450, the generated codewords may be transmitted.

In some examples of the method 400, a code block length of each code block associated with a LDPCC encoded payload may be selected to be an integer multiple of an equal codeword length. In some examples, the method 400 may include combining filler bits with a LDPCC encoded payload to maintain the selected code block length.

In some examples of the method 400, a code block length of each code block of a LDPCC encoded payload may be based at least in part on a length of a TC code block, or an LTE or LTE-A code block, or a combination thereof used to segment a TC encoded payload. In some examples, a length of a code block used to segment a TC encoded payload may be selected based at least in part on a length of a code block used to segment a LDPCC encoded payload.

Figure 5:
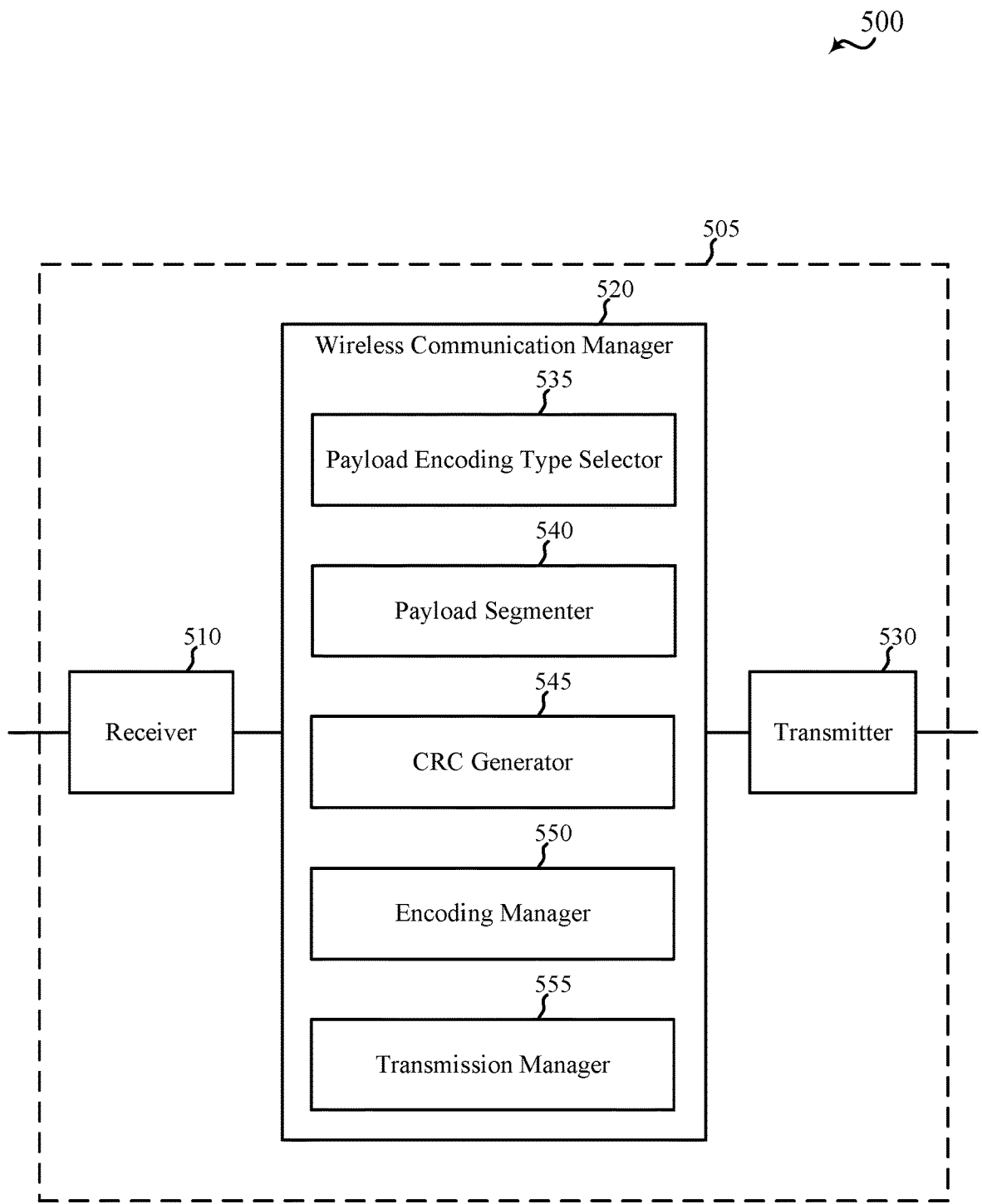
FIG. 5 shows a diagram of a device for use in wireless communication, in accordance with various aspects of the present disclosure.

FIG. 5 shows a diagram 500 of a device 505 for use in wireless communication, in accordance with various aspects of the present disclosure. The device 505 may be an example of aspects of one or more of the base stations 105 or UEs 115 described with reference to FIG. 1 or 2. The device 505 may also be or include a processor. The device 505 may include a receiver 510, a wireless communication manager 520, or a transmitter 530. Each of these components may be in communication with each other.

The components of the device 505 may, individually or collectively, be implemented using one or more application-specific integrated circuits (ASICs) adapted to perform some or all of the applicable functions in hardware. Alternatively, the functions may be performed by one or more other processing units (or cores), on one or more integrated circuits. In some other examples, other types of integrated circuits may be used (e.g., Structured/Platform ASICs, Field Programmable Gate Array (FPGA), a System-on-Chip (SoC), and/or other types of Semi-Custom ICs), which may be programmed in any manner known in the art. The functions of each component may also be implemented, in whole or in part, with instructions embodied in a memory, formatted to be executed by one or more general or application-specific processors.

In some examples, the receiver 510 may include at least one radio frequency (RF) receiver, such as at least one RF receiver operable to receive transmissions over one or more radio frequency spectrum bands. In some examples, the receiver 510 may include an array of receive antennas. In some examples, the one or more radio frequency spectrum bands may be used for LTE/LTE-A or eCC communications, as described, for example, with reference to FIGS. 1-4. The receiver 510 may be used to receive various types of data or control signals (i.e., transmissions) over one or more communication links (or channels) of a wireless communication system, such as one or more communication links (or channels) of the wireless communication system 100 or 200 described with reference to FIG. 1 or 2. In some examples, the receiver 510 may also or alternatively include one or more wired receivers.

In some examples, the transmitter 530 may include at least one RF transmitter, such as at least one RF transmitter operable to transmit over one or more radio frequency spectrum bands. In some examples, the transmitter 530 may include an array of transmit antennas. In some examples, the one or more radio frequency spectrum bands may be used for LTE/LTE-A or eCC communications, as described, for example, with reference to FIGS. 1-4. The transmitter 530 may be used to transmit various types of data or control signals (i.e., transmissions) over one or more communication links (or channels) of a wireless communication system, such as one or more communication links (or channels) of the wireless communication system 100 or 200 described with reference to FIG. 1 or 2. In some examples, the transmitter 530 may also or alternatively include one or more wired transmitters.

In some examples, the wireless communication manager 520 may be used to manage one or more aspects of wireless communication for the device 505. In some examples, part of the wireless communication manager 520 may be incorporated into or shared with the receiver 510 or the transmitter 530. In some examples, the wireless communication manager 520 may include a payload encoding type selector 535, a payload segmenter 540, a CRC generator 545, an encoding manager 550, or a transmission manager 555.

The payload encoding type selector 535 may be used to select an encoding type for each payload of a plurality of payloads. The selecting may include selecting a LDPCC encoding type for at least a first payload and selecting a TC encoding type for at least a second payload. The payload segmenter 540 may be used to segment each payload into a plurality of code blocks. The CRC generator 545 may be used to generate, for each code block, a CRC. The encoding manager 550 may be used to encode each code block and associated CRC in one or more codewords of a plurality of codewords. The encoding may be based at least in part on the selected encoding type for a payload associated with the code block. The transmission manager 555 may be used to transmit the codewords.

Figure 6:
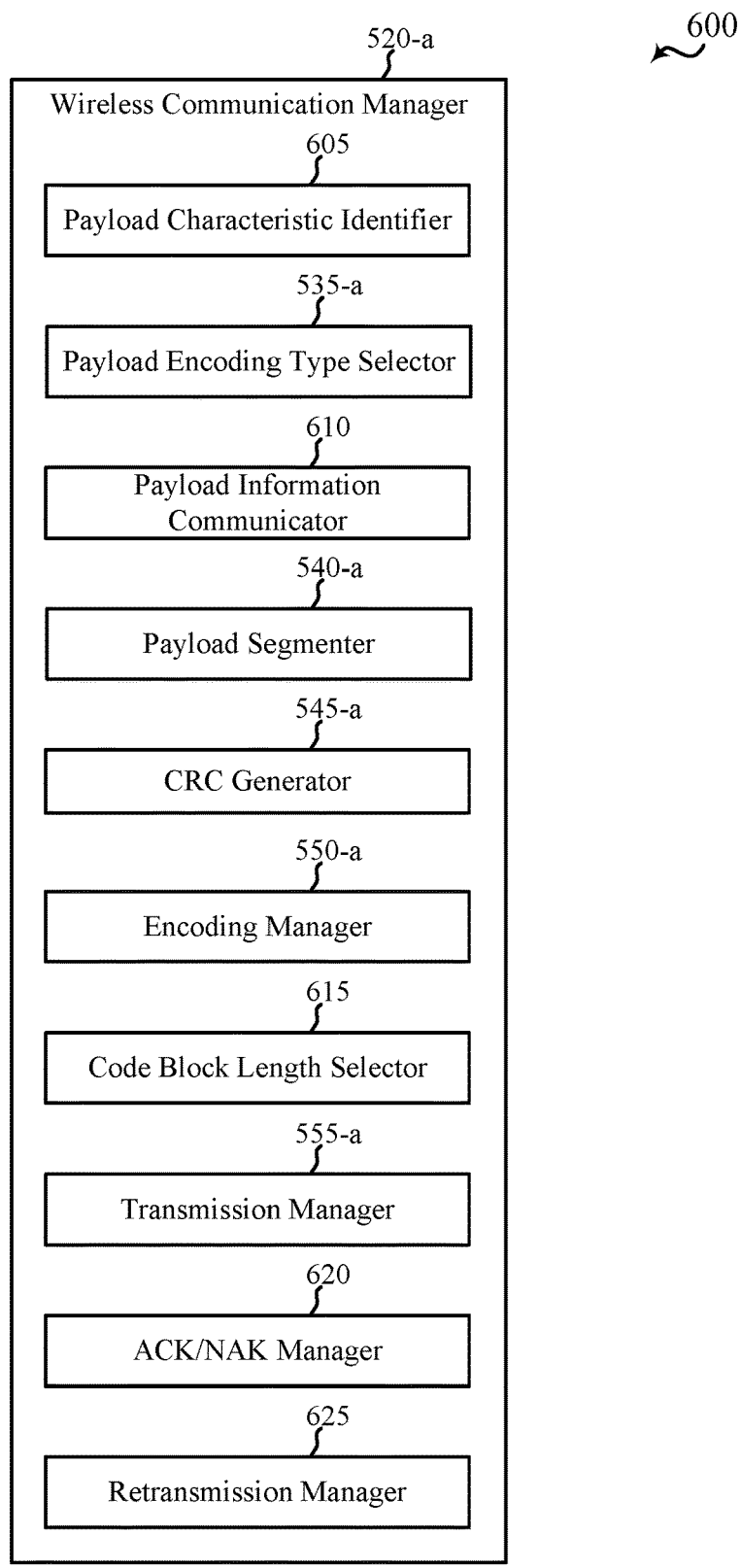
FIG. 6 shows a diagram of a wireless communication manager for use in wireless communication, in accordance with various aspects of the present disclosure.

FIG. 6 shows a diagram 600 of a wireless communication manager 520-*a* for use in wireless communication, in accordance with various aspects of the present disclosure. The wireless communication manager 520-*a* may be an example of aspects of the wireless communication manager 520 described with reference to FIG. 5.

The components of the wireless communication manager 520-*a* may, individually or collectively, be implemented using one or more ASICs adapted to perform some or all of the applicable functions in hardware. Alternatively, the functions may be performed by one or more other processing units (or cores), on one or more integrated circuits. In some other examples, other types of integrated circuits may be used (e.g., Structured/Platform ASICs, FPGAs, a SoC, and/or other types of Semi-Custom ICs), which may be programmed in any manner known in the art. The functions of each component may also be implemented, in whole or in part, with instructions embodied in a memory, formatted to be executed by one or more general or application-specific processors.

In some examples, the wireless communication manager 520-*a* may be used to manage one or more aspects of wireless communication for a base station, UE, or other device, such as one of the base stations 105 or UEs 115 described with reference to FIG. 1 or 2, or the device 505 described with reference to FIG. 5. In some examples, part of the wireless communication manager 520-*a* may be incorporated into or shared with a receiver or a transmitter (e.g., the receiver 510 or the transmitter 530 described with reference to FIG. 5). In some examples, the wireless communication manager 520-*a* may include a payload characteristic identifier 605, a payload encoding type selector 535-*a*, a payload information communicator 610, a payload segmenter 540-*a*, a CRC generator 545-*a*, an encoding manager 550-*a*, a code block length selector 615, a transmission manager 555-*a*, an ACK/NAK manager 620, or a retransmission manager 625.

The payload characteristic identifier 605 may be used to identify one or more characteristics of a plurality of payloads. In some examples, the one or more characteristics may include at least one of a payload size, a transmission data rate, a transmission resource size, or a combination thereof. In some examples, a characteristic of a payload may be based solely on the payload. In some examples, a characteristic of a payload may be based on characteristics of a plurality of payloads (e.g., a characteristic of a payload may be an average value or a maximum value).

The payload encoding type selector 535-*a* may be used to select an encoding type for each payload of a plurality of payloads. The selecting may include selecting a LDPCC encoding type for at least a first payload and selecting a TC encoding type for at least a second payload. In some examples, an encoding type for a payload may be selected based at least in part on a characteristic of the payload, as identified by the payload characteristic identifier 605.

The payload information communicator 610 may be used to transmit, for at least one of the payloads, at least one of: an indication of the payload size, an indication of the transmission data rate, an indication of the transmission resource size, or an indication of the selected encoding type.

The payload segmenter 540-*a* may be used to segment each payload into a plurality of code blocks. The CRC generator 545-*a* may be used to generate, for each code block, a CRC. The encoding manager 550-*a* may be used to encode each code block and associated CRC in one or more codewords of a plurality of codewords. The encoding may be based at least in part on the selected encoding type for a payload associated with the code block. In some examples, each codeword associated with a code block of the first payload may have an equal codeword length.

The code block length selector 615 may be used, in conjunction with the encoding manager 550-*a*, and in some examples, to select a code block length of each code block associated with at least the first payload to be an integer multiple of the equal codeword length. In some examples, the code block length selector 615 may combine filler bits with the first payload, prior to or as part of the encoding performed by the encoding manager 550-*a*, to maintain the selected code block length. In some examples, each code block associated with the first payload may have a code block length that is an integer multiple of an equal codeword length associated with each codeword corresponding to the code block.

In some examples, the code block length selector 615 may be used to select a code block length of each code block of at least the first payload based at least in part on a length of a TC code block, or a LTE or LTE-A code block, or a combination thereof used to segment at least the second payload. In some examples, the code block length selector 615 may be used to select a length of a TC code block used to segment at least the second payload based at least in part on a length of each code block used to segment at least the first payload. The code block length(s) may be selected prior to or as part of the encoding performed by the encoding manager 550-*a*. The transmission manager 555-*a* may be used to transmit the codewords.

The ACK/NAK manager 620 may be used to receive one of an ACK or a NAK for each code block. The retransmission manager 625 may be used, when a NAK is received for a code block, to retransmit one or more codewords and CRCs associated with the code block. For example, when a NAK of a code block associated with the first payload is received, the retransmission manager 625 may be used to retransmit a plurality of LDPCC codewords associated with the code block and a CRC associated with the code block.

Figure 7:
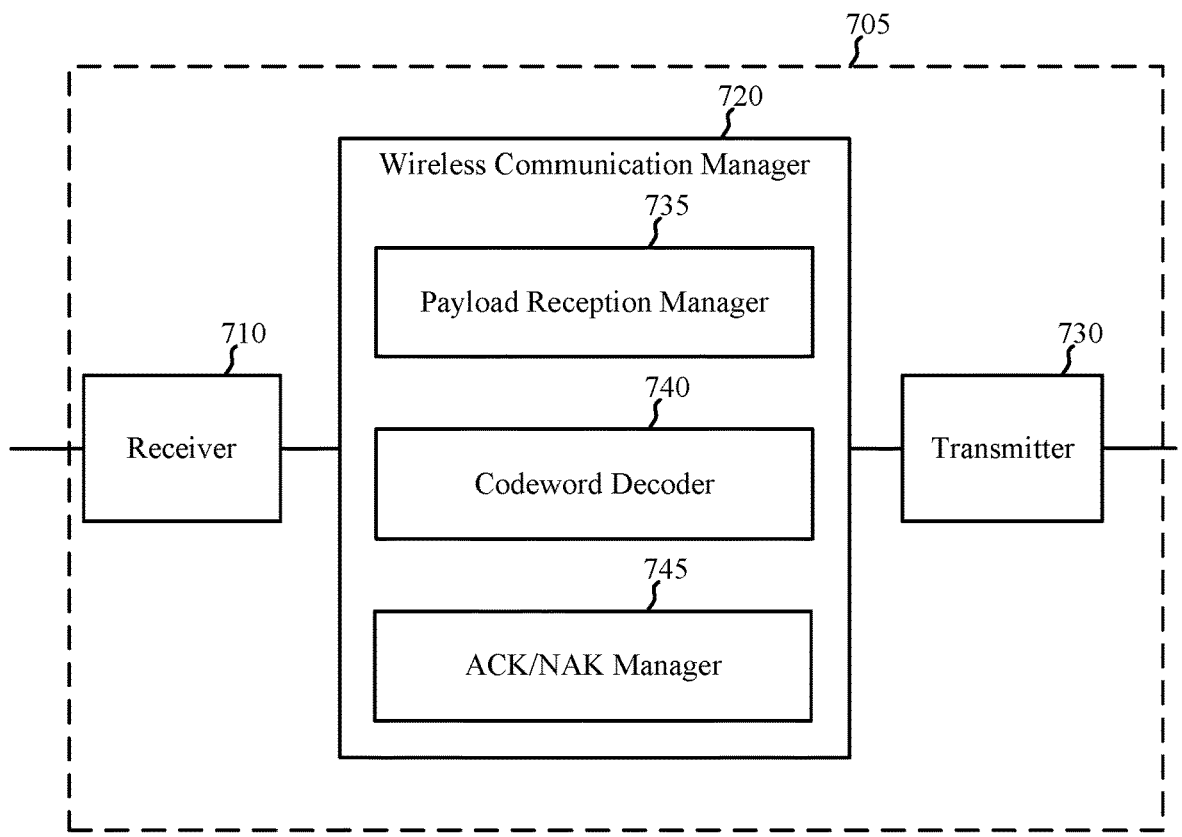
FIG. 7 shows a diagram of a device for use in wireless communication, in accordance with various aspects of the present disclosure.

FIG. 7 shows a diagram 700 of a device 705 for use in wireless communication, in accordance with various aspects of the present disclosure. The device 705 may be an example of aspects of one or more of the base stations 105 or UEs 115 described with reference to FIG. 1 or 2, or aspects of the device 505 described with reference to FIG. 5. The device 705 may also be or include a processor. The device 705 may include a receiver 710, a wireless communication manager 720, or a transmitter 730. Each of these components may be in communication with each other.

The components of the device 705 may, individually or collectively, be implemented using one or more ASICs adapted to perform some or all of the applicable functions in hardware. Alternatively, the functions may be performed by one or more other processing units (or cores), on one or more integrated circuits. In some other examples, other types of integrated circuits may be used (e.g., Structured/Platform ASICs, FPGAs, a SoC, and/or other types of Semi-Custom ICs), which may be programmed in any manner known in the art. The functions of each component may also be implemented, in whole or in part, with instructions embodied in a memory, formatted to be executed by one or more general or application-specific processors.

In some examples, the receiver 710 may include at least one RF receiver, such as at least one RF receiver operable to receive transmissions over one or more radio frequency spectrum bands. In some examples, the receiver 710 may include an array of receive antennas. In some examples, the one or more radio frequency spectrum bands may be used for LTE/LTE-A or eCC communications, as described, for example, with reference to FIGS. 1-4. The receiver 710 may be used to receive various types of data or control signals (i.e., transmissions) over one or more communication links (or channels) of a wireless communication system, such as one or more communication links (or channels) of the wireless communication system 100 or 200 described with reference to FIG. 1 or 2. In some examples, the receiver 710 may also or alternatively include one or more wired receivers.

In some examples, the transmitter 730 may include at least one RF transmitter, such as at least one RF transmitter operable to transmit over one or more radio frequency spectrum bands. In some examples, the transmitter 730 may include an array of transmit antennas. In some examples, the one or more radio frequency spectrum bands may be used for LTE/LTE-A or eCC communications, as described, for example, with reference to FIGS. 1-4. The transmitter 730 may be used to transmit various types of data or control signals (i.e., transmissions) over one or more communication links (or channels) of a wireless communication system, such as one or more communication links (or channels) of the wireless communication system 100 or 200 described with reference to FIG. 1 or 2. In some examples, the transmitter 730 may also or alternatively include one or more wired transmitters.

In some examples, the wireless communication manager 720 may be used to manage one or more aspects of wireless communication for the device 705. In some examples, part of the wireless communication manager 720 may be incorporated into or shared with the receiver 710 or the transmitter 730. In some examples, the wireless communication manager 720 may include a payload reception manager 735, a codeword decoder 740, or an ACK/NAK manager 745.

The payload reception manager 735 may be used to receive a plurality of codewords associated with at least a first payload encoded using a LDPCC encoding type and at least a second payload encoded using a TC encoding type. The codeword decoder 740 may be used to decode a set of the codewords associated with the first payload and a CRC. The ACK/NAK manager 745 may be used to transmit one of an ACK or a NAK for the set of the codewords.

Figure 8:
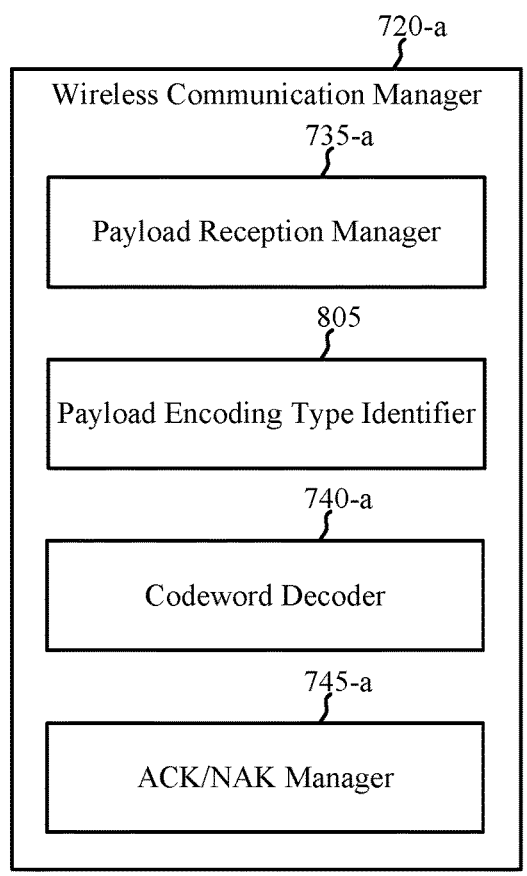
FIG. 8 shows a diagram of a wireless communication manager for use in wireless communication, in accordance with various aspects of the present disclosure.

FIG. 8 shows a diagram 800 of a wireless communication manager 720-*a* for use in wireless communication, in accordance with various aspects of the present disclosure. The wireless communication manager 720-*a* may be an example of aspects of the wireless communication manager 720 described with reference to FIG. 7.

The components of the wireless communication manager 720-*a* may, individually or collectively, be implemented using one or more ASICs adapted to perform some or all of the applicable functions in hardware. Alternatively, the functions may be performed by one or more other processing units (or cores), on one or more integrated circuits. In some other examples, other types of integrated circuits may be used (e.g., Structured/Platform ASICs, FPGAs, a SoC, and/or other types of Semi-Custom ICs), which may be programmed in any manner known in the art. The functions of each component may also be implemented, in whole or in part, with instructions embodied in a memory, formatted to be executed by one or more general or application-specific processors.

In some examples, the wireless communication manager 720-*a* may be used to manage one or more aspects of wireless communication for a base station, UE, or other device, such as one of the base stations 105 or UEs 115 described with reference to FIG. 1 or 2, or the device 705 described with reference to FIG. 7. In some examples, part of the wireless communication manager 720-*a* may be incorporated into or shared with a receiver or a transmitter (e.g., the receiver 710 or the transmitter 730 described with reference to FIG. 7). In some examples, the wireless communication manager 720-*a* may include a payload reception manager 735-*a*, a payload encoding type identifier 805, a codeword decoder 740-*a*, or an ACK/NAK manager 745-*a*.

The payload reception manager 735-*a* may be used to receive a plurality of codewords associated with at least a first payload encoded using a LDPCC encoding type and at least a second payload encoded using a TC encoding type.

The payload encoding type identifier 805 may be used to receive an indication that the LDPCC encoding type is used to encode the first payload, or receive an indication that the TC encoding type is used to encode the second payload. The payload encoding type identifier 805 may additionally or alternatively be used to determine the LDPCC encoding type is used for the first payload, or determine the TC encoding type is used for the second payload, based at least in part on receiving an indication of a payload size, an indication of a transmission data rate, an indication of a transmission resource size, or a combination thereof for the first payload or the second payload.

The codeword decoder 740-*a* may be used to decode a set of the codewords associated with the first payload and a CRC. The ACK/NAK manager 745-*a* may be used to transmit one of an ACK or a NAK for the set of the codewords.

Figure 9:
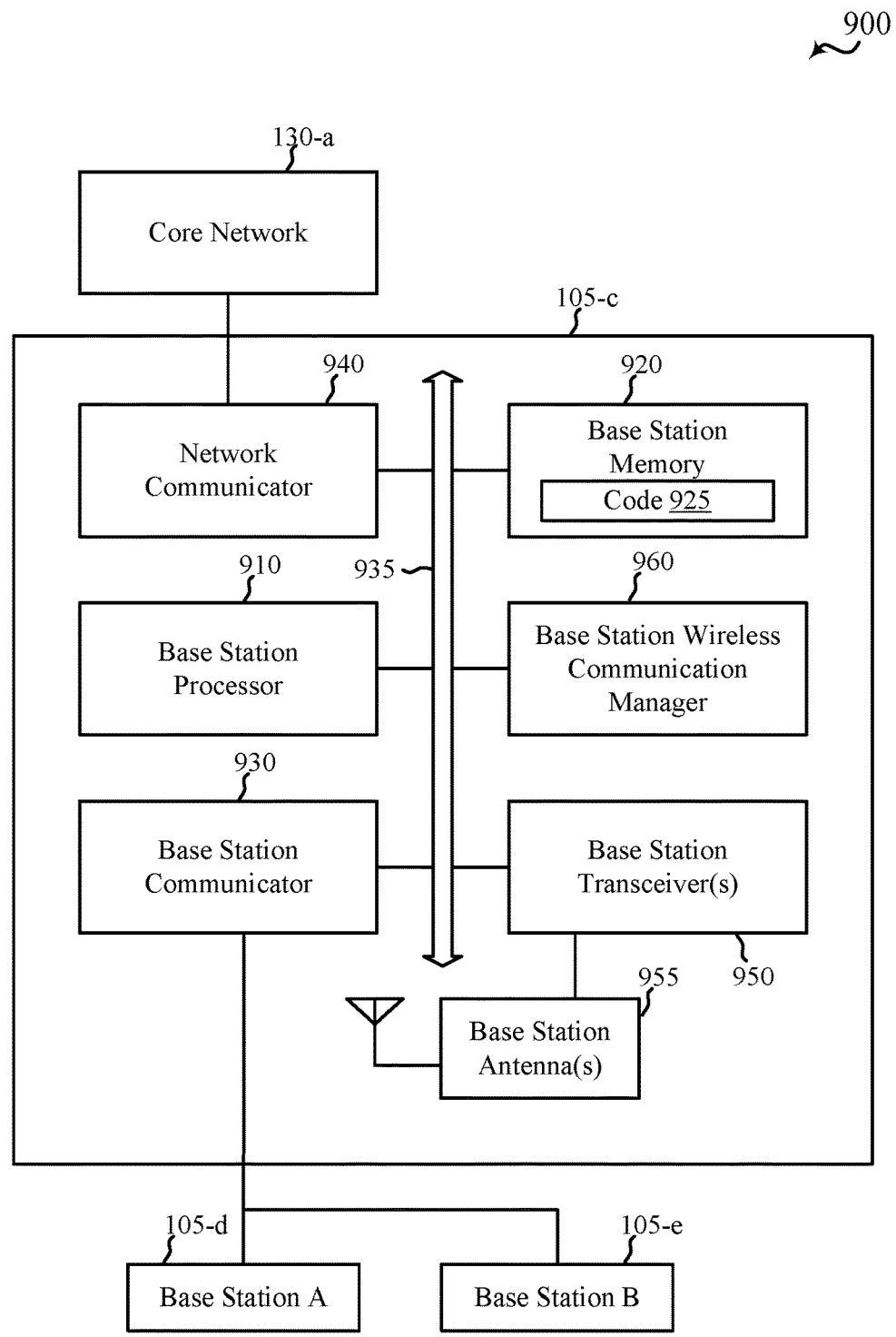
FIG. 9 shows a diagram of a base station (e.g., a base station forming part or all of an eNB) for use in wireless communication, in accordance with various aspects of the present disclosure.

FIG. 9 shows a diagram 900 of a base station 105-*c* (e.g., a base station forming part or all of an eNB) for use in wireless communication, in accordance with various aspects of the present disclosure. In some examples, the base station 105-*c* may be an example of aspects of one or more of the base stations 105 described with reference to FIG. 1 or 2, or aspects of one or more of device 505 or 705 described with reference to FIG. 5 or 7. The base station 105-*c* may be configured to implement or facilitate at least some of the base station or device features or functions described with reference to FIGS. 1-8.

The base station 105-*c* may include a base station processor 910, a base station memory 920, at least one base station transceiver (represented by base station transceiver(s) 950), at least one base station antenna (represented by base station antenna(s) 955), or a base station wireless communication manager 960. The base station 105-*c* may also include one or more of a base station communicator 930 or a network communicator 940. Each of these components may be in communication with each other, directly or indirectly, over one or more buses 935.

The base station memory 920 may include random access memory (RAM) or read-only memory (ROM). The base station memory 920 may store computer-readable, computer-executable code 925 containing instructions executable by the base station processor 910 to perform various functions described herein related to wireless communication, including, for example, selecting an encoding type, from among a LDPCC encoding type and a TC encoding type, for each payload of a plurality of payloads, or receiving a plurality of codewords associated with at least a first payload encoded using a LDPCC encoding type and a second payload encoded using a TC encoding type. Alternatively, the computer-executable code 925 may not be directly executable by the base station processor 910 but be configured to cause the base station 105-*c* (e.g., when compiled and executed) to perform various of the functions described herein.

The base station processor 910 may include an intelligent hardware device, e.g., a central processing unit (CPU), a microcontroller, an ASIC, etc. The base station processor 910 may process information received through the base station transceiver(s) 950, the base station communicator 930, or the network communicator 940. The base station processor 910 may also process information to be sent to the transceiver(s) 950 for transmission through the antenna(s) 955, to the base station communicator 930, for transmission to one or more other base stations 105-*d* and 105-*e*, or to the network communicator 940 for transmission to a core network 130-*a*, which may be an example of one or more aspects of the core network 130 described with reference to FIG. 1. The base station processor 910 may handle, alone or in connection with the base station wireless communication manager 960, various aspects of communicating over (or managing communications over) one or more radio frequency spectrum bands.

The base station transceiver(s) 950 may include a modem configured to modulate packets and provide the modulated packets to the base station antenna(s) 955 for transmission, and to demodulate packets received from the base station antenna(s) 955. The base station transceiver(s) 950 may, in some examples, be implemented as one or more base station transmitters and one or more separate base station receivers. The base station transceiver(s) 950 may support communications in the one or more radio frequency spectrum bands. The base station transceiver(s) 950 may be configured to communicate bi-directionally, via the antenna(s) 955, with one or more UEs, such as one or more of the UEs 115 described with reference to FIG. 1 or 2, or one or more of device 505 or 705 described with reference to FIG. 5 or 7. The base station 105-*c* may, for example, include multiple base station antennas 955 (e.g., an antenna array). The base station 105-*c* may communicate with the core network 130-*a* through the network communicator 940. The base station 105-*c* may also communicate with other base stations, such as the base stations 105-*d* and 105-*e*, using the base station communicator 930.

The base station wireless communication manager 960 may be configured to program or control some or all of the features or functions described with reference to FIGS. 1-8 related to wireless communication over one or more radio frequency spectrum bands. The base station wireless communication manager 960, or portions of it, may include a processor, or some or all of the functions of the base station wireless communication manager 960 may be performed by the base station processor 910 or in connection with the base station processor 910. In some examples, the base station wireless communication manager 960 may be an example of the wireless communication manager 520 or 720 described with reference to FIG. 5, 6, 7, or 8.

Figure 10:
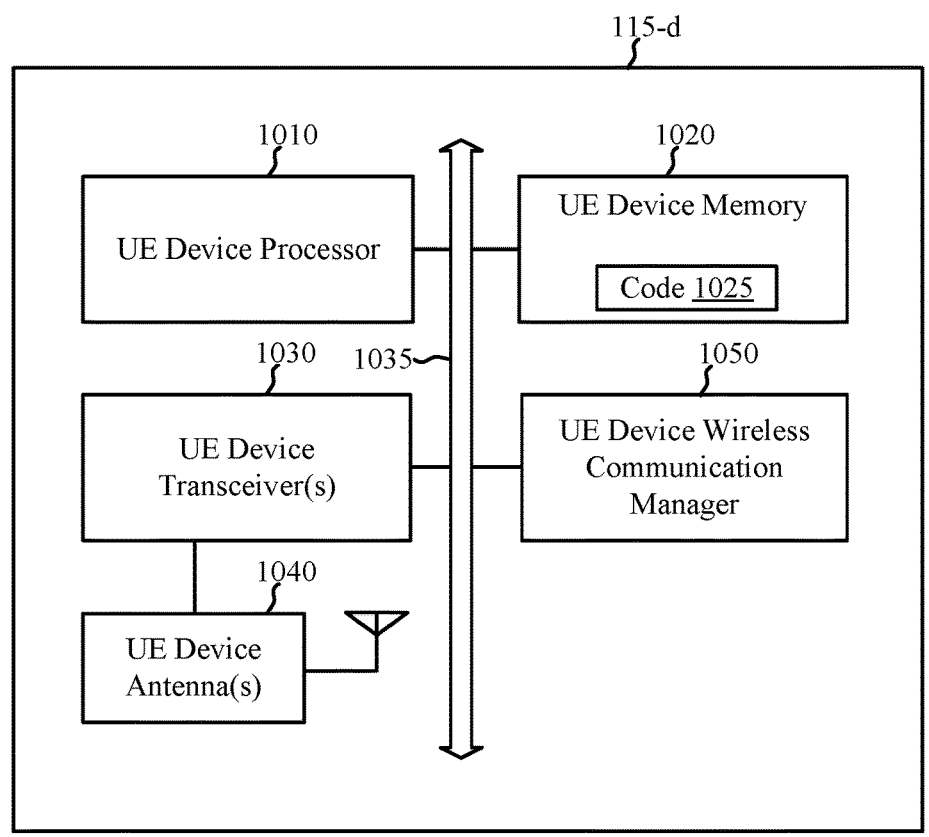
FIG. 10 shows a diagram of a UE for use in wireless communication, in accordance with various aspects of the present disclosure.

FIG. 10 shows a diagram 1000 of a UE 115-*d* for use in wireless communication, in accordance with various aspects of the present disclosure. The UE 115-*d* may have various configurations and may be a wireless communication device, a personal computer (e.g., a laptop computer, a netbook computer, a tablet computer, etc.), a handheld device, a cellular telephone, a smart phone, a cordless phone, a wireless modem, a WLL station, a personal PDA, a DVR, an internet appliance, a gaming console, an e-reader, a narrow-*b* and device, an IoT device, etc. The UE 115-*d* may, in some examples, have an internal power supply (not shown), such as a small battery, to facilitate mobile or remote operation. In some examples, the UE 115-*d* may be an example of aspects of one or more of the UEs 115 described with reference to FIG. 1 or 2, or aspects of one or more of device 505 or 705 described with reference to FIG. 5 or 7. The UE 115-*d* may be configured to implement at least some of the UE or device features or functions described with reference to FIGS. 1-8.

The UE 115-*d* may include a UE processor 1010, a UE memory 1020, at least one UE transceiver (represented by UE transceiver(s) 1030), at least one UE antenna (represented by UE antenna(s) 1040), or a UE device wireless communication manager 1050. Each of these components may be in communication with each other, directly or indirectly, over one or more buses 1035.

The UE memory 1020 may include RAM or ROM. The UE memory 1020 may store computer-readable, computer-executable code 1025 containing instructions executable by the UE processor 1010 to perform various functions described herein related to wireless communication, including, for example, selecting an encoding type, from among a LDPCC encoding type and a TC encoding type, for each payload of a plurality of payloads, or receiving a plurality of codewords associated with at least a first payload encoded using a LDPCC encoding type and a second payload encoded using a TC encoding type. Alternatively, the computer-executable code 1025 may not be directly executable by the UE processor 1010 but be configured to cause the UE 115-*d* (e.g., when compiled and executed) to perform various of the functions described herein.

The UE processor 1010 may include an intelligent hardware device, e.g., a CPU, a microcontroller, an ASIC, etc. The UE processor 1010 may process information received through the UE transceiver(s) 1030 or information to be sent to the UE transceiver(s) 1030 for transmission through the UE antenna(s) 1040. The UE processor 1010 may handle, alone or in connection with the UE device wireless communication manager 1050, various aspects of communicating over (or managing communications over) one or more radio frequency spectrum bands.

The UE transceiver(s) 1030 may include a modem configured to modulate packets and provide the modulated packets to the UE antenna(s) 1040 for transmission, and to demodulate packets received from the UE antenna(s) 1040. The UE transceiver(s) 1030 may, in some examples, be implemented as one or more UE transmitters and one or more separate UE receivers. The UE transceiver(s) 1030 may support communications in the one or more radio frequency spectrum bands. The UE transceiver(s) 1030 may be configured to communicate bi-directionally, via the UE antenna(s) 1040, with one or more base stations or other devices, such as one or more of the base stations 105 described with reference to FIG. 1, 2, or 9, or one or more of device 505 or 705 described with reference to FIG. 5 or 7. While the UE 115-*d* may include a single UE antenna, there may be examples in which the UE 115-*d* may include multiple UE antennas 1040.

The UE device wireless communication manager 1050 may be configured to program or control some or all of the features or functions described with reference to FIGS. 1-8 related to wireless communication over one or more radio frequency spectrum bands. The UE device wireless communication manager 1050, or portions of it, may include a processor, or some or all of the functions of the UE device wireless communication manager 1050 may be performed by the UE processor 1010 or in connection with the UE processor 1010. In some examples, the UE device wireless communication manager 1050 may be an example of the wireless communication manager 520 or 720 described with reference to FIG. 5, 6, 7, or 8.

Figure 11:
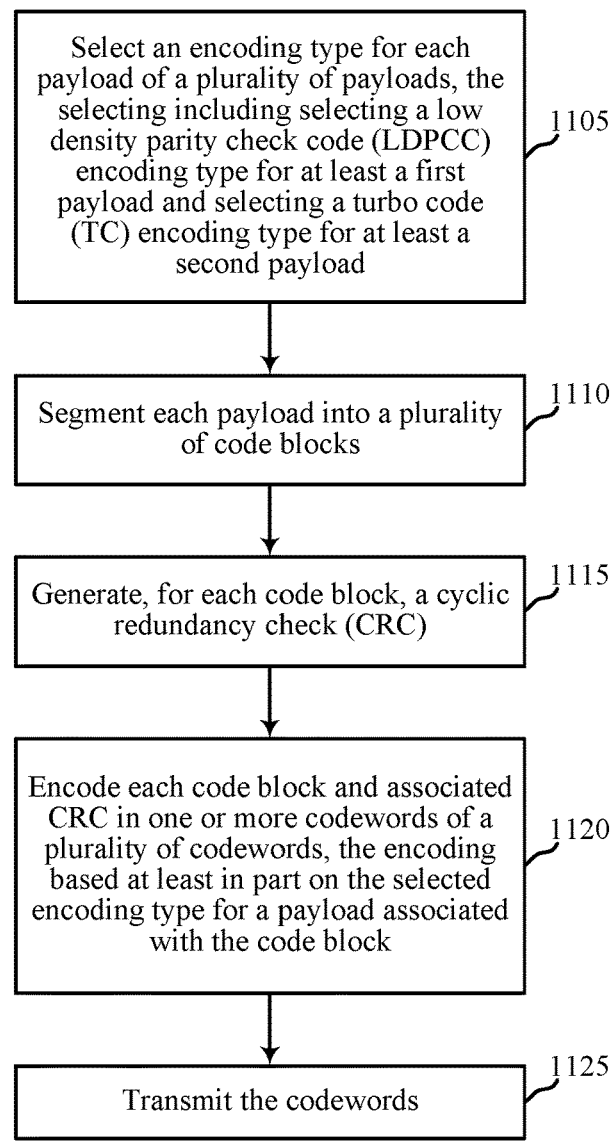
FIG. 11 is a flow chart illustrating an example of a method for wireless communication, in accordance with various aspects of the present disclosure.

FIG. 11 is a flow chart illustrating an example of a method 1100 for wireless communication, in accordance with various aspects of the present disclosure. For clarity, the method 1100 is described below with reference to aspects of the device 505 described with reference to FIG. 5, or aspects of one or more of the wireless communication manager 520, 520-*a*, 720, or 720-*a* described with reference to FIG. 5, 6, 7, or 8. In some examples, the method 1100 is described below with reference to one or more aspects of the base station wireless communication manager 960 described with reference to FIG. 9, or with reference to one or more aspects of the UE device wireless communication manager 1050 described with reference to FIG. 10. In some examples, a device (e.g., a base station or UE) may perform one or more of the functions described below using special-purpose hardware.

At block 1105, the method 1100 may include selecting an encoding type for each payload of a plurality of payloads. The selecting may include selecting a LDPCC encoding type for at least a first payload and selecting a TC encoding type for at least a second payload. The operation(s) at block 1105 may be performed using the wireless communication manager 520, 520-*a*, 720, or 720-*a* described with reference to FIG. 5, 6, 7, or 8, or base station wireless communication manager 960 described with reference to FIG. 9, or UE device wireless communication manager 1050 described with reference to FIG. 10, or the payload encoding type selector 535 described with reference to FIG. 5 or 6.

At block 1110, the method 1100 may include segmenting each payload into a plurality of code blocks. The operation(s) at block 1110 may be performed using the wireless communication manager 520, 520-*a*, 720, or 720-*a* described with reference to FIG. 5, 6, 7, or 8, or base station wireless communication manager 960 described with reference to FIG. 9, or UE device wireless communication manager 1050 described with reference to FIG. 10, or the payload segmenter 540 described with reference to FIG. 5 or 6.

At block 1115, the method 1100 may include generating, for each code block, a CRC. The operation(s) at block 1115 may be performed using the wireless communication manager 520, 520-*a*, 720, or 720-*a* described with reference to FIG. 5, 6, 7, or 8, or base station wireless communication manager 960 described with reference to FIG. 9, or UE device wireless communication manager 1050 described with reference to FIG. 10, or the CRC generator 545 described with reference to FIG. 5 or 6.

At block 1120, the method 1100 may include encoding each code block and associated CRC in one or more codewords of a plurality of codewords. The encoding may be based at least in part on the selected encoding type for a payload associated with the code block. The operation(s) at block 1120 may be performed using the wireless communication manager 520, 520-*a*, 720, or 720-*a* described with reference to FIG. 5, 6, 7, or 8, or base station wireless communication manager 960 described with reference to FIG. 9, or UE device wireless communication manager 1050 described with reference to FIG. 10, or the encoding manager 550 described with reference to FIG. 5 or 6.

At block 1125, the method 1100 may include transmitting the codewords. The operation(s) at block 1125 may be performed using the wireless communication manager 520, 520-*a*, 720, or 720-*a* described with reference to FIG. 5, 6, 7, or 8, or base station wireless communication manager 960 described with reference to FIG. 9, or UE device wireless communication manager 1050 described with reference to FIG. 10, or the transmission manager 555 described with reference to FIG. 5 or 6.

Figure 12:
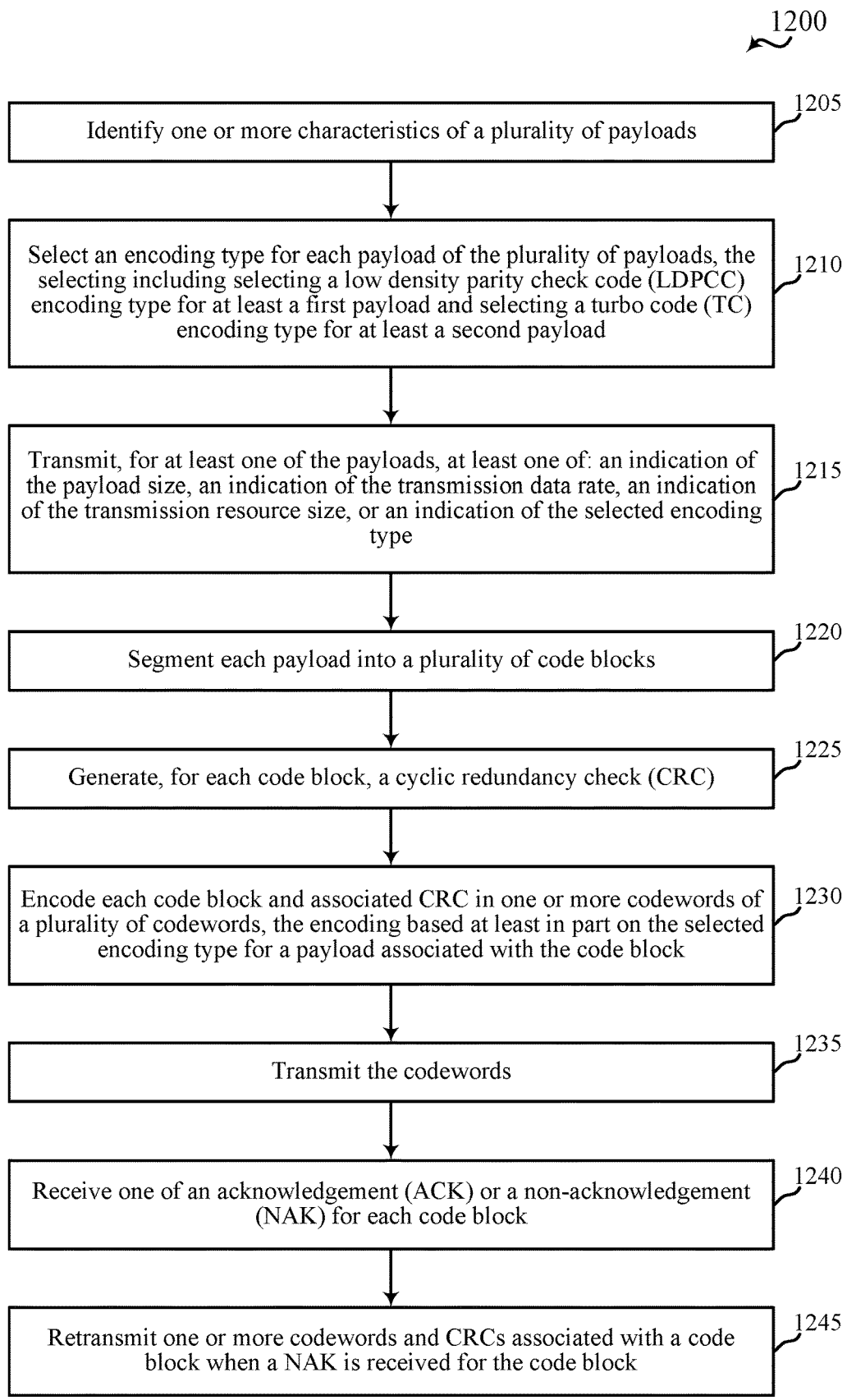
FIG. 12 is a flow chart illustrating an example of a method for wireless communication, in accordance with various aspects of the present disclosure.

FIG. 12 is a flow chart illustrating an example of a method 1200 for wireless communication, in accordance with various aspects of the present disclosure. For clarity, the method 1100 is described below with reference to aspects of the device 505 described with reference to FIG. 5, or aspects of one or more of the wireless communication manager 520, 520-*a*, 720, or 720-*a* described with reference to FIG. 5, 6, 7, or 8. In some examples, the method 1100 is described below with reference to one or more aspects of the base station wireless communication manager 960 described with reference to FIG. 9, or UE device wireless communication manager 1050 described with reference to FIG. 10. In some examples, a device (e.g., a base station or UE) may perform one or more of the functions described below using special-purpose hardware.

At block 1205, the method 1200 may include identifying one or more characteristics of a plurality of payloads. In some examples, the one or more characteristics may include at least one of a payload size, a transmission data rate, a transmission resource size, or a combination thereof. In some examples, a characteristic of a payload may be based solely on the payload. In some examples, a characteristic of a payload may be based on characteristics of a plurality of payloads (e.g., a characteristic of a payload may be an average value or a maximum value). The operation(s) at block 1205 may be performed using the wireless communication manager 520, 520-*a*, 720, or 720-*a* described with reference to FIG. 5, 6, 7, or 8, or base station wireless communication manager 960 described with reference to FIG. 9, or UE device wireless communication manager 1050 described with reference to FIG. 10, or the payload characteristic identifier 605 described with reference to FIG. 6.

At block 1210, the method 1200 may include selecting an encoding type for each payload of the plurality of payloads. The selecting may include selecting a LDPCC encoding type for at least a first payload and selecting a TC encoding type for at least a second payload. In some examples, an encoding type for a payload may be selected based at least in part on a characteristic of the payload, as identified at block 1205. The operation(s) at block 1210 may be performed using the wireless communication manager 520, 520-*a*, 720, or 720-*a* described with reference to FIG. 5, 6, 7, or 8, or base station wireless communication manager 960 described with reference to FIG. 9, or UE device wireless communication manager 1050 described with reference to FIG. 10, or the payload encoding type selector 535 described with reference to FIG. 5 or 6.

At block 1215, the method 1200 may include transmitting, for at least one of the payloads, at least one of: an indication of the payload size, an indication of the transmission data rate, an indication of the transmission resource size, or an indication of the selected encoding type. The operation(s) at block 1215 may be performed using the wireless communication manager 520, 520-*a*, 720, or 720-*a* described with reference to FIG. 5, 6, 7, or 8, or base station wireless communication manager 960 described with reference to FIG. 9, or UE device wireless communication manager 1050 described with reference to FIG. 10, or the payload information communicator 610 described with reference to FIG. 6.

At block 1220, the method 1200 may include segmenting each payload into a plurality of code blocks. The operation(s) at block 1220 may be performed using the wireless communication manager 520, 520-*a*, 720, or 720-*a* described with reference to FIG. 5, 6, 7, or 8, or base station wireless communication manager 960 described with reference to FIG. 9, or UE device wireless communication manager 1050 described with reference to FIG. 10, or the payload segmenter 540 described with reference to FIG. 5 or 6.

At block 1225, the method 1200 may include generating, for each code block, a CRC. The operation(s) at block 1225 may be performed using the wireless communication manager 520, 520-*a*, 720, or 720-*a* described with reference to FIG. 5, 6, 7, or 8, or base station wireless communication manager 960 described with reference to FIG. 9, or UE device wireless communication manager 1050 described with reference to FIG. 10, or the CRC generator 545 described with reference to FIG. 5 or 6.

At block 1230, the method 1200 may include encoding each code block and associated CRC in one or more codewords of a plurality of codewords. The encoding may be based at least in part on the selected encoding type for a payload associated with the code block. In some examples of the method 1200, each codeword associated with a code block of the first payload may have an equal codeword length. The operation(s) at block 1230 may be performed using the wireless communication manager 520, 520-*a*, 720, or 720-*a* described with reference to FIG. 5, 6, 7, or 8, or base station wireless communication manager 960 described with reference to FIG. 9, or UE device wireless communication manager 1050 described with reference to FIG. 10, or the encoding manager 550 described with reference to FIG. 5 or 6.

At block 1235, the method 1200 may include transmitting the codewords. The operation(s) at block 1235 may be performed using the wireless communication manager 520, 520-*a*, 720, or 720-*a* described with reference to FIG. 5, 6, 7, or 8, or base station wireless communication manager 960 described with reference to FIG. 9, or UE device wireless communication manager 1050 described with reference to FIG. 10, or the transmission manager 555 described with reference to FIG. 5 or 6.

At block 1240, the method 1200 may include receiving one of an ACK or a NAK for each code block. The operation(s) at block 1240 may be performed using the wireless communication manager 520, 520-*a*, 720, or 720-*a* described with reference to FIG. 5, 6, 7, or 8, or base station wireless communication manager 960 described with reference to FIG. 9, or UE device wireless communication manager 1050 described with reference to FIG. 10, or the ACK/NAK manager 620 described with reference to FIG. 6.

At block 1245, and when a NAK is received for a code block, the method 1200 may include retransmitting one or more codewords and CRCs associated with the code block. For example, when a NAK of a code block associated with the first payload is received, the method 1200 may include retransmitting a plurality of LDPCC codewords associated with the code block and a CRC associated with the code block. The operation(s) at block 1245 may be performed using the wireless communication manager 520, 520-*a*, 720, or 720-*a* described with reference to FIG. 5, 6, 7, or 8, or base station wireless communication manager 960 described with reference to FIG. 9, or UE device wireless communication manager 1050 described with reference to FIG. 10, or the retransmission manager 625 described with reference to FIG. 6.

In some examples, the method 1200 may include selecting a code block length of each code block associated with at least the first payload to be an integer multiple of the equal codeword length. In some examples, the method 1200 may include combining filler bits with the first payload, prior to or as part of the operation(s) at block 1220, to maintain the selected code block length. In some examples, each code block associated with the first payload may have a code block length that is an integer multiple of an equal codeword length associated with each codeword corresponding to the code block.

In some examples, the method 1200 may include selecting a code block length of each code block of at least the first payload based at least in part on a length of a TC code block, or an LTE or LTE-A code block, or a combination thereof used to segment at least the second payload. The code block length may be selected prior to or as part of the operation(s) at block 1220.

In some examples, the method 1200 may include selecting a length of a TC code block used to segment at least the second payload based at least in part on a length of each code block used to segment at least the first payload. The length of the TC code block may be selected prior to or as part of the operation(s) at block 1220.

Figure 13:
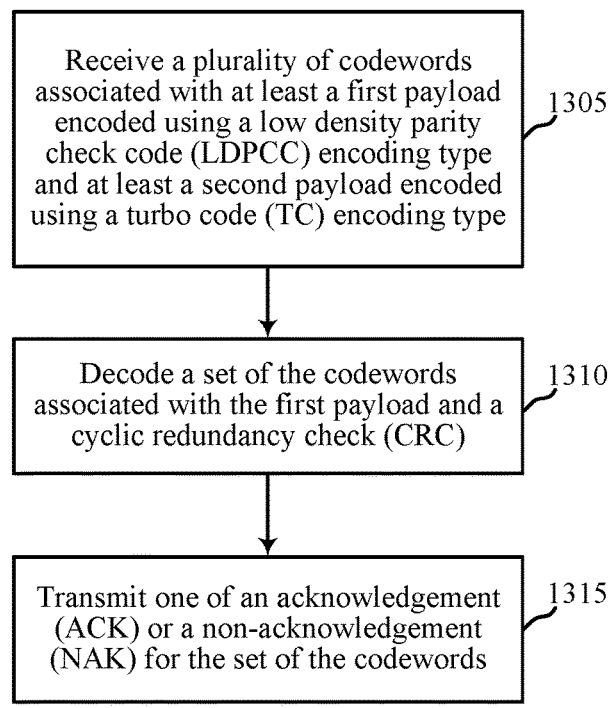
FIG. 13 is a flow chart illustrating an example of a method for wireless communication, in accordance with various aspects of the present disclosure.

FIG. 13 is a flow chart illustrating an example of a method 1300 for wireless communication, in accordance with various aspects of the present disclosure. For clarity, the method 1100 is described below with reference to aspects of the device 505 described with reference to FIG. 5, or aspects of one or more of the wireless communication manager 520, 520-*a*, 720, or 720-*a* described with reference to FIG. 5, 6, 7, or 8. In some examples, the method 1100 is described below with reference to one or more aspects of the base station wireless communication manager 960 described with reference to FIG. 9, or with reference to one or more aspects of the UE device wireless communication manager 1050 described with reference to FIG. 10. In some examples, a device (e.g., a base station or UE) may perform one or more of the functions described below using special-purpose hardware.

At block 1305, the method 1300 may include receiving a plurality of codewords associated with at least a first payload encoded using a LDPCC encoding type and at least a second payload encoded using a TC encoding type. The operation(s) at block 1305 may be performed using the wireless communication manager 520, 520-*a*, 720, or 720-*a* described with reference to FIG. 5, 6, 7, or 8, or base station wireless communication manager 960 described with reference to FIG. 9, or UE device wireless communication manager 1050 described with reference to FIG. 10, or the payload reception manager 735 or 735-*a* described with reference to FIG. 7 or 8.

At block 1310, the method 1300 may include decoding a set of the codewords associated with the first payload and a CRC. The operation(s) at block 1310 may be performed using the wireless communication manager 520, 520-*a*, 720, or 720-*a* described with reference to FIG. 5, 6, 7, or 8, or base station wireless communication manager 960 described with reference to FIG. 9, or UE device wireless communication manager 1050 described with reference to FIG. 10, or the codeword decoder 740 described with reference to FIG. 7 or 8.

At block 1315, the method 1300 may include transmitting one of an ACK or a NAK for the set of the codewords. The operation(s) at block 1315 may be performed using the wireless communication manager 520, 520-*a*, 720, or 720-*a* described with reference to FIG. 5, 6, 7, or 8, or base station wireless communication manager 960 described with reference to FIG. 9, or UE device wireless communication manager 1050 described with reference to FIG. 10, or the ACK/NAK manager 745 described with reference to FIG. 7 or 8.

In some examples, the method 1300 may include receiving an indication that the LDPCC encoding type is used to encode the first payload, or receiving an indication that the TC encoding type is used to encode the second payload. Alternatively, the method 1300 may include determining the LDPCC encoding type is used for the first payload, or determining the TC encoding type is used for the second payload, based at least in part on receiving an indication of a payload size, an indication of a transmission data rate, an indication of a transmission resource size, or a combination thereof for the first payload or the second payload.

It should be noted that the methods 1100, 1200, and 1300 provide examples of methods for wireless communication, and that the operations of the method 1100, 1200, or 1300 may be rearranged or otherwise modified.

The detailed description set forth above in connection with the appended drawings describes examples and does not represent all of the examples that may be implemented or that are within the scope of the claims. The terms "example" and "exemplary," when used in this description, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a digital signal processor (DSP), an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC (i.e., A and B and C).

Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the generic principles defined herein may be applied to other variations without departing from the spirit or scope of the disclosure. Throughout this disclosure the term "example" or "exemplary" indicates an example or instance and does not imply or require any preference for the noted example. Thus, the disclosure is not to be limited to the examples and designs described herein but is to be accorded the widest scope consistent with the principles and novel features disclosed herein.

What is claimed is:

1. A method for wireless communication, comprising:
segmenting a payload to be encoded into a plurality of code blocks;
generating, for each code block, a cyclic redundancy check (CRC);
associating the CRC generated for each code block with each respective code block;
selecting low density parity check code (LDPCC) encoding based at least in part on at least one characteristic of the payload to be encoded;
performing LDPCC encoding of each code block and associated CRC to generate one or more codewords of a plurality of codewords; and
transmitting the one or more codewords generated by performing the LDPCC encoding.

2. The method of claim 1, wherein the at least one characteristic comprises a transmission data rate of the payload.

3. The method of claim 1, wherein the at least one characteristic comprises a transmission resource size for the payload.

4. The method of claim 1, wherein the at least one characteristic comprises a size of the payload.

5. The method of claim 4, further comprising:
selecting LDPCC encoding when the size of the payload is less than a threshold.

6. The method of claim 1, wherein each codeword has an equal codeword length.

7. The method of claim 6, further comprising:
selecting a code block length of each code block to be an integer multiple of the equal codeword length.

8. The method of claim 6, further comprising:
combining filler bits with the payload to achieve the selected code block length.

9. The method of claim 1, further comprising:
receiving a non-acknowledgement (NAK) of a code block of the plurality of code blocks associated with the payload.

10. The method of claim 9, further comprising:
retransmitting a plurality of LDPCC codewords associated with the code block and the CRC associated with the code block based at least in part on the received NAK of the code block.

11. A device for wireless communication, comprising:
a processor;
memory coupled with the processor; and
instructions stored in the memory and executable by the processor to cause the device to:
segment a payload to be encoded into a plurality of code blocks;
generate, for each code block, a cyclic redundancy check (CRC);
associate the CRC generated for each code block with each respective code block;
select low density parity check code (LDPCC) encoding based at least in part on at least one characteristic of the payload to be encoded;
perform LDPCC encoding of each code block and associated CRC in one or more codewords of a plurality of codewords; and
transmit the one or more codewords generated by performing the LDPCC encoding.

12. The device of claim 11, wherein the at least one characteristic comprises a transmission data rate of the payload.

13. The device of claim 11, wherein the at least one characteristic comprises a transmission resource size for the payload.

14. The device of claim 11, wherein the at least one characteristic comprises a size of the payload.

15. The device of claim 14, wherein the instructions are executable by the processor to:
   select LDPCC encoding when the size of the payload is less than a threshold.

16. The device of claim 11, wherein each codeword has an equal codeword length.

17. The device of claim 16, wherein the instructions are executable by the processor to cause the device to:
   select a code block length of each code block to be an integer multiple of the equal codeword length.

18. The device of claim 16, wherein the instructions are executable by the processor to cause the device to:
   combine filler bits with the payload to achieve the selected code block length.

19. The device of claim 11, wherein the instructions are executable by the processor to cause the device to:
   receive a non-acknowledgement (NAK) of a code block of the plurality of code blocks associated with the payload.

20. The device of claim 19, wherein the instructions are executable by the processor to cause the device to:
   retransmit a plurality of LDPCC codewords associated with the code block and the CRC associated with the code block based at least in part on the received NAK of the code block.

21. A non-transitory computer readable medium storing code for wireless communication, the code comprising instructions that, when executed by a processor, cause a wireless communication device to:
   segment a payload to be encoded into a plurality of code blocks;
   generate, for each code block, a cyclic redundancy check (CRC);
   associate the CRC generated for each code block with each respective code block;
   select low density parity check code (LDPCC) encoding based at least in part on at least one characteristic of the payload to be encoded;
   perform low density parity check code (LDPCC) encoding of each code block and associated CRC to generate one or more codewords of a plurality of codewords; and
   transmit the one or more codewords generated by performing the LDPCC encoding.

22. The non-transitory computer readable medium of claim 21, wherein the at least one characteristic comprises a transmission data rate of the payload.

23. The non-transitory computer readable medium of claim 21, wherein the at least one characteristic comprises a transmission resource size for the payload.

24. The non-transitory computer readable medium of claim 21, wherein the at least one characteristic comprises a size of the payload.

25. The non-transitory computer readable medium of claim 24, wherein the code further comprises instructions that cause the wireless communication device to:
   select LDPCC encoding when the size of the payload is less than a threshold.

26. The non-transitory computer readable medium of claim 21, wherein each codeword has an equal codeword length.

27. The non-transitory computer readable medium of claim 26, wherein the code further comprises instructions that cause the wireless communication device to:
   select a code block length of each code block to be an integer multiple of the equal codeword length.

28. The non-transitory computer readable medium of claim 26, wherein the code further comprises instructions that cause the wireless communication device to:
   combine filler bits with the payload to achieve the selected code block length.

29. The non-transitory computer readable medium of claim 21, wherein the code further comprises instructions that cause the wireless communication device to:
   receive a non-acknowledgement (NAK) of a code block of the plurality of code blocks associated with the payload.

30. The non-transitory computer readable medium of claim 29, wherein the code further comprises instructions that cause the wireless communication device to:
   retransmit a plurality of LDPCC codewords associated with the code block and the CRC associated with the code block based at least in part on the received NAK of the code block.

* * * * *